United States Patent
Wu et al.

(10) Patent No.: US 12,225,712 B2
(45) Date of Patent: Feb. 11, 2025

(54) METHOD OF MANUFACTURING SEMICONDUCTOR STRUCTURE AND SEMICONDUCTOR STRUCTURE

(71) Applicant: CHANGXIN MEMORY TECHNOLOGIES, INC., Hefei (CN)

(72) Inventors: Gongyi Wu, Hefei (CN); Xiaoling Wang, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 559 days.

(21) Appl. No.: 17/453,875

(22) Filed: Nov. 8, 2021

(65) Prior Publication Data

US 2023/0005928 A1 Jan. 5, 2023

Related U.S. Application Data

(63) Continuation of application No. PCT/CN2021/107153, filed on Jul. 19, 2021.

(30) Foreign Application Priority Data

Jul. 2, 2021 (CN) .......................... 202110753761.4

(51) Int. Cl.
  *H10B 12/00* (2023.01)
(52) U.S. Cl.
  CPC .......... *H10B 12/34* (2023.02); *H10B 12/053* (2023.02); *H10B 12/482* (2023.02); *H10B 12/485* (2023.02)

(58) Field of Classification Search
CPC .... H10B 12/34; H10B 12/053; H10B 12/482; H10B 12/485; H10B 12/0335; H10B 12/488; H10B 12/05; H01L 29/78642
See application file for complete search history.

(56) References Cited

U.S. PATENT DOCUMENTS

| | | |
|---|---|---|
| 7,713,823 B2 | 5/2010 | Sung et al. |
| 8,274,112 B2 | 9/2012 | Kim et al. |

(Continued)

FOREIGN PATENT DOCUMENTS

| | | |
|---|---|---|
| CN | 101783348 A | 7/2010 |
| CN | 101425515 B | 9/2014 |
| CN | 111863814 A | 10/2020 |

OTHER PUBLICATIONS

International Search Report cited in PCT/CN2021/107153, mailed Mar. 29, 2022, 8 pages.

*Primary Examiner* — Kimberly N Rizkallah
*Assistant Examiner* — Nicholas B Michaud
(74) *Attorney, Agent, or Firm* — Syncoda LLC; Feng Ma

(57) ABSTRACT

The present disclosure provides a method of manufacturing a semiconductor structure, and a semiconductor structure, relating to the technical field of semiconductors. The method of manufacturing a semiconductor structure includes: providing a substrate; forming multiple initial active pillars on the substrate; forming a gate layer between initial active pillars; and forming a first dielectric layer with openings on the gate layer and on the initial active pillars; removing part of the initial active pillar located in each opening to form an active pillar; and removing part of the gate layer to form an isolation trench and a word line, such that two adjacent active pillars in the same row are located on two sides of the isolation trench.

10 Claims, 18 Drawing Sheets

(56) References Cited

U.S. PATENT DOCUMENTS

| | | | |
|---|---|---|---|
| 11,049,874 B2 | 6/2021 | Wang et al. | |
| 2006/0175643 A1* | 8/2006 | Nomura | H01L 28/65 |
| | | | 257/295 |
| 2009/0166723 A1 | 7/2009 | Sung et al. | |
| 2011/0111568 A1* | 5/2011 | Kim | H10B 12/482 |
| | | | 257/E21.421 |
| 2011/0223731 A1* | 9/2011 | Chung | H10B 12/488 |
| | | | 438/270 |
| 2012/0104489 A1 | 5/2012 | Hong | |
| 2017/0062575 A1 | 3/2017 | Song et al. | |
| 2020/0343260 A1* | 10/2020 | Wang | H01L 29/7827 |

* cited by examiner

METHOD OF MANUFACTURING SEMICONDUCTOR STRUCTURE AND SEMICONDUCTOR STRUCTURE

CROSS-REFERENCE TO RELATED APPLICATIONS

This is a continuation of International Patent Application No. PCT/CN2021/107153, filed on Jul. 19, 2021, which claims the priority to Chinese Patent Application No. 202110753761.4, titled "METHOD OF MANUFACTURING SEMICONDUCTOR STRUCTURE AND SEMICONDUCTOR STRUCTURE" and filed on Jul. 2, 2021. The entire contents of International Patent Application No. PCT/CN2021/107153 and Chinese Patent Application No. 202110753761.4 are incorporated herein by reference.

TECHNICAL FIELD

The present disclosure relates to, but is not limited to, a method of manufacturing a semiconductor structure and a semiconductor structure.

BACKGROUND

In the development of dynamic random access memory (DRAM), methods for improving device integration include reducing the feature size of a memory cell array device and improving the cell structure. However, as the feature size decreases, small-sized transistors will produce severe short-channel effects. Therefore, reducing the area occupied by memory cells without changing the feature size by improving the topology of the memory cells is another effective way to improve the device integration. For example, current mainstream processes use 6F2 cells instead of 8F2 cells in the prior art to significantly improve the integration of DRAM. 4F2 DRAM memory cells with a higher storage density are the future development trend, which requires the memory cells to have a length and width of 2F.

In the 4F2 cell structure, the structure of the word line transistor has changed accordingly. As the spacing between word lines and an isolation structure of the memory array continue to shrink, the interference between word lines becomes more severe, reducing the performance of the semiconductor structure.

SUMMARY

An overview of the subject matter detailed in the present disclosure is provided below, which is not intended to limit the protection scope of the claims.

The present disclosure provides a method of manufacturing a semiconductor structure and a semiconductor structure.

According to a first aspect, the embodiments of the present disclosure provide a method of manufacturing a semiconductor structure. The method of manufacturing a semiconductor structure includes:

providing a substrate;

forming multiple initial active pillars on the substrate, where the multiple initial active pillars are arranged in an array;

forming a gate layer between the initial active pillars, where the gate layer is connected to sidewalls of each initial active pillar;

forming a first dielectric layer on the gate layer and on the initial active pillars;

forming, in the first dielectric layer, openings extending along a row arrangement direction of the initial active pillars; where projection of one of the openings on the substrate partially overlaps with projection of each of the initial active pillars in the same row on the substrate, and projection, which does not overlap with the projection of the opening on the substrate, of two adjacent initial active pillars in the same row on the substrate is located on two sides of the opening respectively; and removing the initial active pillar exposed in each opening to form an active pillar; and removing the gate layer exposed in each opening to form an isolation trench and a word line, where two adjacent active pillars located in the same row are located on two sides of the isolation trench.

According to a second aspect, the embodiments of the present disclosure provide a semiconductor structure. The semiconductor structure includes:

a substrate;

multiple active pillars, where the multiple active pillars are arranged on the substrate in an array; and multiple isolation structures provided on the substrate, where each of the isolation structures includes a first side and a second side that are arranged opposite to each other, the isolation structure extends along an arrangement direction of the active pillars in the same row, such that two adjacent active pillars in the same row are separated on two opposite sides of the isolation structure.

Other aspects of the present disclosure are understandable upon reading and understanding of the drawings and detailed description.

BRIEF DESCRIPTION OF THE DRAWINGS

The drawings incorporated into the specification and constituting part of the specification illustrate the embodiments of the present disclosure, and are used together with the description to explain the principles of the embodiments of the present disclosure. In these drawings, similar reference numerals are used to represent similar elements. The drawings in the following description are part rather than all of the embodiments of the present disclosure. Those skilled in the art may derive other drawings based on these drawings without creative efforts.

DETAILED DESCRIPTION

The technical solutions in the embodiments of the present disclosure are described below clearly and completely with reference to the drawings in the embodiments of the present disclosure. Apparently, the described embodiments are merely part rather than all of the embodiments of the present disclosure. All other embodiments obtained by those skilled in the art based on the embodiments of the present disclosure without creative efforts should fall within the protection scope of the present disclosure. It should be noted that the embodiments in the present disclosure and features in the embodiments may be combined with each other in a non-conflicting manner.

With the development of dynamic random access memory (DRAM), methods for improving device integration include reducing a feature size of a memory cell array device and improving a cell structure. However, as the feature size of the memory cell array device decreases, small-sized transistors will produce severe short-channel effects. Therefore, reducing the area occupied by memory cells without changing the feature size by improving the topology of the memory cells is another effective way to improve the device integration. For example, current mainstream processes use 6F2 cells instead of 8F2 cells in the prior art to significantly improve the integration of DRAM. 4F2 DRAM memory cells with a higher storage density are the future development trend, which requires the memory cells to have a length and width of 2F.

Figure 1:
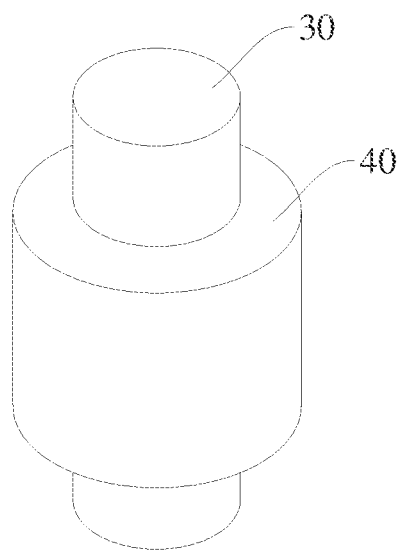
FIG. 1 is a schematic diagram of an active pillar in a semiconductor structure in the related art.
Figure 2:
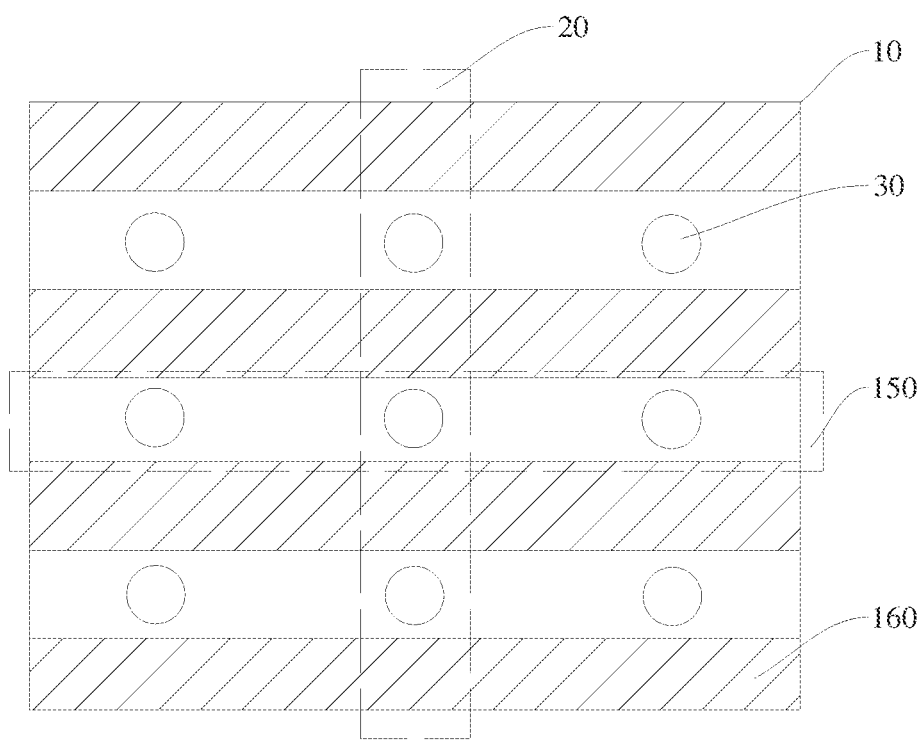
FIG. 2 is a schematic top view of the semiconductor structure in the related art.

In the 4F2 cell structure, the structure of the word line transistor has been changed accordingly. As shown in FIG. 1 and FIG. 2, the transistor in the related art includes a substrate 10, multiple bit line structures 20 formed in the substrate, and multiple active pillars 30 arranged in an array on the substrate. The transistor further includes multiple word lines 150 for connecting adjacent active pillars 30 in the same row, and an isolation structure 160 for separating two adjacent word lines 150. A ring-shaped gate layer 40 is formed on the active pillars 30, and an extension direction of the bit line structure 20 may be perpendicular to that of the word line 150. As the spacing between word lines and the isolation structure of the memory array continue to shrink, the interference between word lines becomes more severe, which greatly reduces the performance of the semiconductor structure.

Therefore, in the manufacturing process of the semiconductor structure in the embodiments of the present disclosure, two adjacent active pillars in the same row are separated on two sides of the isolation structure, which increases the spacing between two active pillars in the same column on adjacent word lines, thereby reducing the signal interference between adjacent word lines and improving the performance of the semiconductor structure.

The present disclosure proposes a method of manufacturing a semiconductor structure, which is described below with reference to the accompanying drawings and specific implementations.

Figure 3:
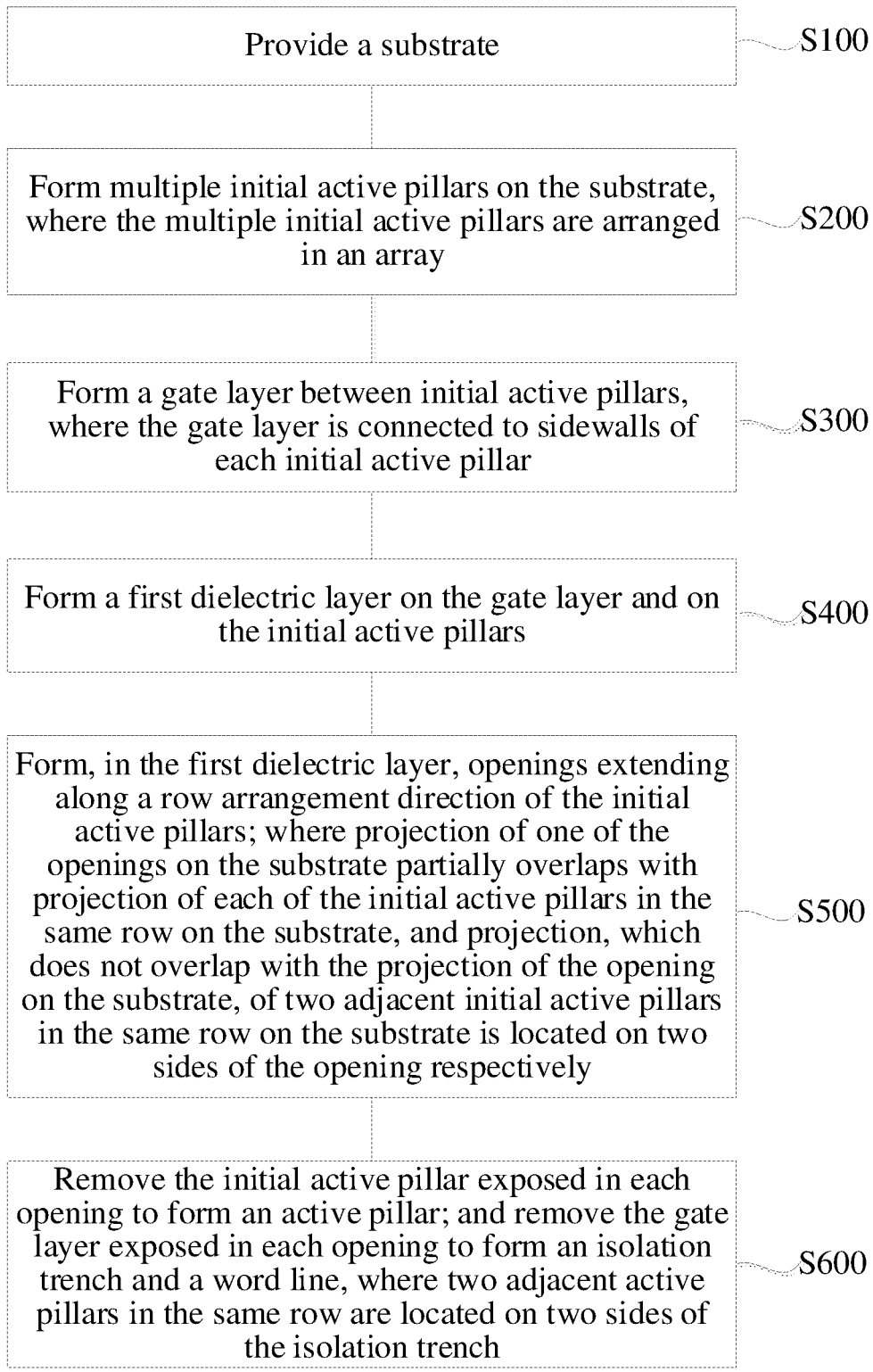
FIG. 3 is a process flowchart of a method of manufacturing a semiconductor structure according to an exemplary embodiment.
Figure 4:
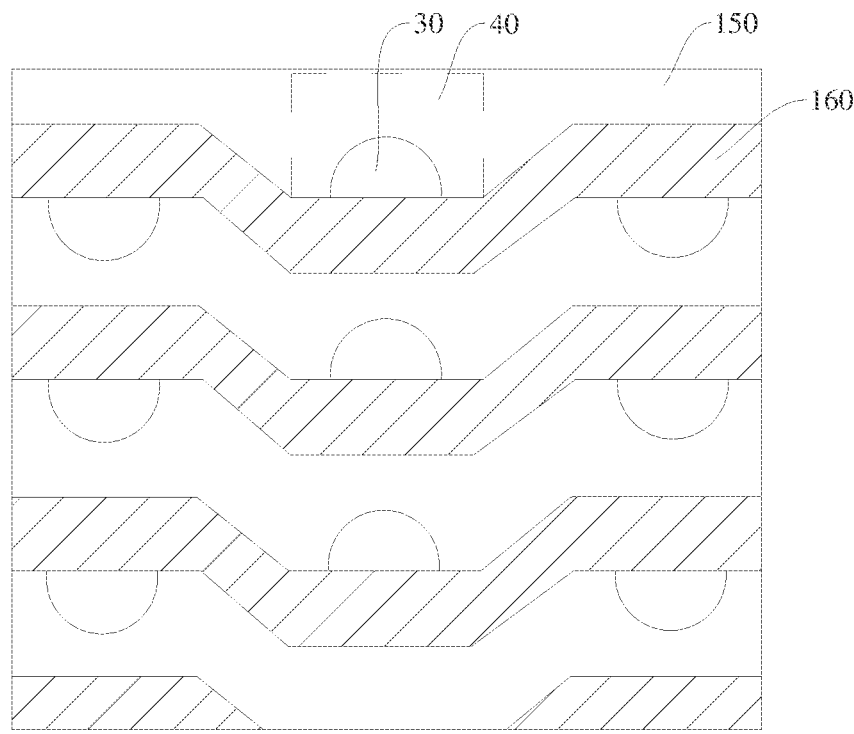
FIG. 4 is a schematic top view of a semiconductor structure manufactured by the method of manufacturing a semiconductor structure according to an exemplary embodiment.

FIG. 3 is a flowchart of a method of manufacturing a semiconductor structure according to an embodiment of the present disclosure; FIG. 4 is a schematic top view of a semiconductor structure; FIG. 5 to FIG. 33 are schematic diagrams of various stages in the method of manufacturing a semiconductor structure. The method of manufacturing a semiconductor structure is described in detail below with reference to FIG. 4 to FIG. 33.

The semiconductor structure is not limited in this embodiment. The semiconductor structure is described below by taking a dynamic random access memory (DRAM) as an example, but this embodiment is not limited to this, and the semiconductor structure in this embodiment may also be other structures.

As shown in FIG. 3, an embodiment of the present application provides a method of manufacturing a semiconductor structure. The method of manufacturing a semiconductor structure includes the following steps:

Step S100: Provide a substrate.

For example, as shown in FIG. 4, the substrate 10 serves as a support member of a memory and is used to support other components provided thereon. A material of the substrate 10 may be, for example, monocrystalline silicon, polycrystalline silicon, amorphous silicon, silicon-germanium compound, silicon-on-insulator, and other materials known to those skilled in the art.

It should be noted that after the step of providing a substrate, bit line structures 20 may further be formed in the substrate such that one of the bit line structures 20 is connected to a source of a subsequently formed transistor, and the formation of the bit line structures 20 in the substrate 10 includes the following steps:

Step S110: Form multiple first grooves 101 that are arranged at intervals along a first direction in the substrate 10.

Figure 5:
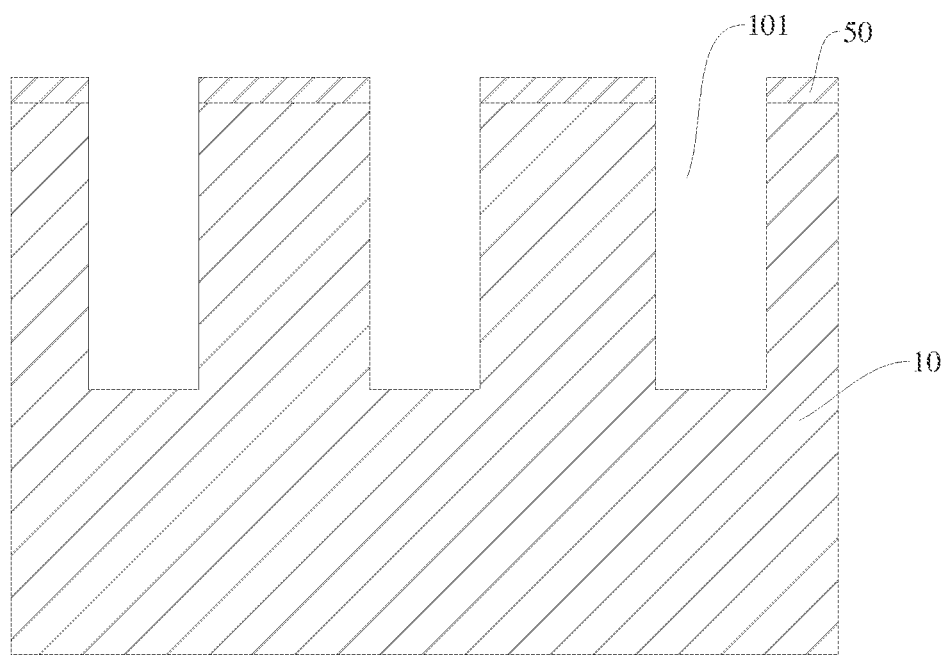
FIG. 5 is a schematic diagram of forming a first groove in the method of manufacturing a semiconductor structure according to an exemplary embodiment.

For example, as shown in FIG. 5, a third mask layer 50 can be formed on the substrate 10 by a deposition process, and then the third mask layer 50 is patterned to form multiple third mask openings 501 that are arranged at intervals along the first direction in the third mask layer 50.

A first photoresist layer may be formed on the third mask layer 50, and a third mask pattern is formed on the first photoresist layer by exposure or development etching. Part of the third mask layer is removed by using the first photoresist layer with the third mask pattern as a mask plate, to form multiple third mask openings 501 arranged at intervals.

In this embodiment, by transferring the third mask pattern to the third mask layer and then etching the substrate by using the third mask layer as the mask plate, the accuracy of the pattern transfer and the performance of the semiconductor structure can be improved.

After the third mask openings 501 are formed, the substrate 10 exposed in each third mask opening 501 is removed by using an etching solution or etching gas to form multiple first grooves 101 in the substrate 10.

Step S120: Form a first barrier layer 211 on an inner wall of each first groove 101, where a top surface of the first barrier layer 211 is lower than a top surface of the substrate 10.

Figure 6:
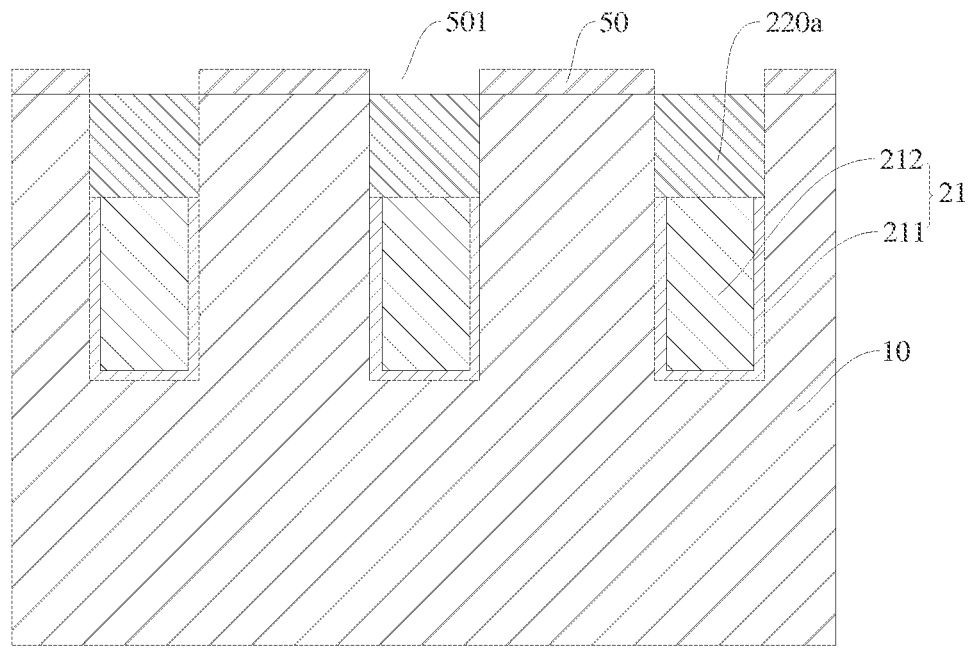
FIG. 6 is a schematic diagram of forming a bit line and a polysilicon layer in the method of manufacturing a semiconductor structure according to an exemplary embodiment.

For example, as shown in FIG. 6, a first initial barrier layer can be formed on the inner wall of each first groove 101 by an atomic layer deposition process, and the first initial barrier layer extends to the outside of the first groove 101 and covers the top surface of the substrate 10.

The first initial barrier layer located on the top surface of the substrate 10 and part of the first initial barrier layer that is located on the inner wall of the first groove 101 are removed, and the retained first initial barrier layer on the inner wall of the first groove 101 forms the first barrier layer 211.

A material of the first barrier layer 211 includes a conductive material such as titanium nitride; the first barrier layer 211 is conductive and can also prevent a conductive material in a subsequently formed first conductive layer 212 from diffusing into the substrate.

Step S130: Fill each first groove 101 with a first conductive layer 212, where the top of the first conductive layer 212 is flush with the top of the first barrier layer 211.

The first conductive layer 212 located in each of the first grooves 100 and the first barrier layer 211 wrapping around the first conductive layer 212 form one bit line 21, and multiple bit lines 21 are arranged at intervals along the first direction on the substrate 10.

A material of the first conductive layer 212 includes a conductive material such as tungsten.

Step S140: Form a polysilicon layer 220a on the first conductive layer 212, where a top surface of the polysilicon layer 220a is flush with the top surface of the substrate 10.

Figure 7:
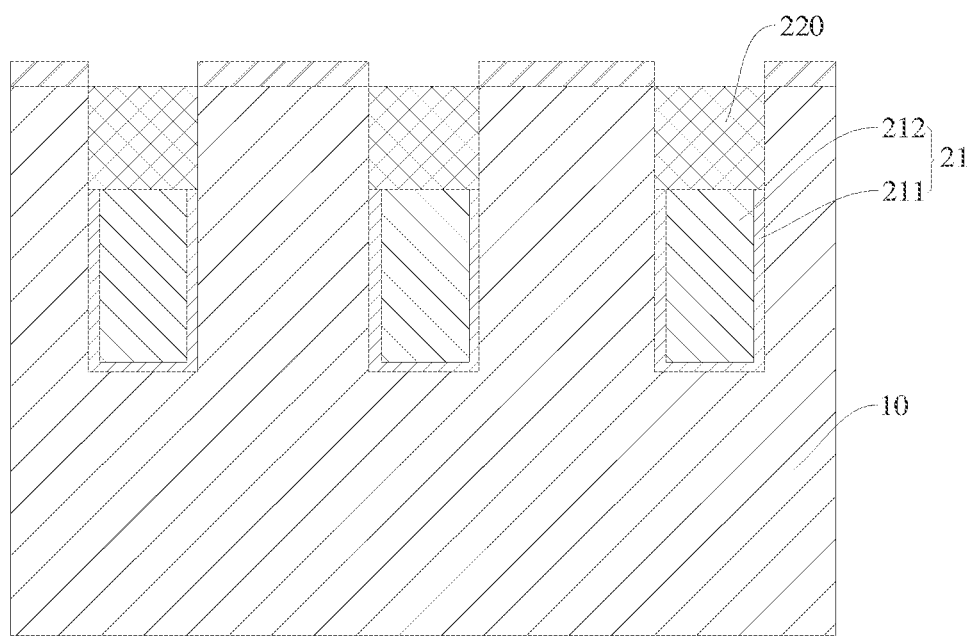
FIG. 7 is a schematic diagram of forming a bit line contact portion in the method of manufacturing a semiconductor structure according to an exemplary embodiment.
Figure 8:
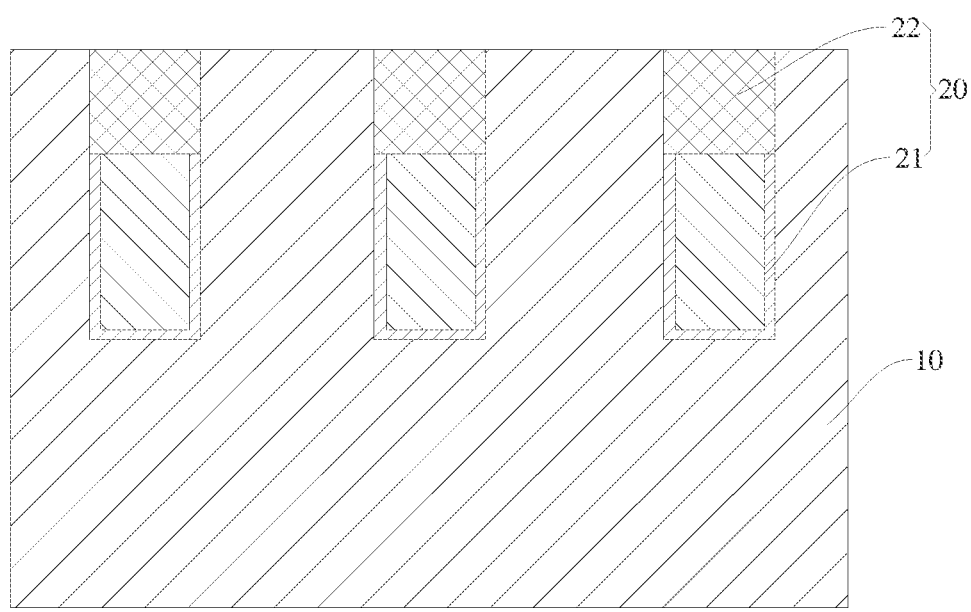
FIG. 8 is a schematic diagram of forming a bit line structure in the method of manufacturing a semiconductor structure according to an exemplary embodiment.

For example, as shown in FIG. 7, the polysilicon layer 220a can be formed on the first conductive layer 212 by using a physical vapor deposition process or a chemical vapor deposition process. The polysilicon layer fills a region enclosed by first conductive layer 212 and base 10.

After the polysilicon layer 220a is formed, the polysilicon layer can be doped with ions by ion injection, such that the ion-doped polysilicon layer 220 forms a bit line contact portion 22.

After that, the third mask layer 50 retained on the top surface of the substrate 10 is removed.

It should be noted that in this embodiment, the polysilicon layer 220a can be doped with N-type ions, for example, phosphorus ions, to form N-type polysilicon in the polysilicon layer; or the polysilicon layer 220a can be doped with P-type ions, for example, boron ions, to form P-type polysilicon in the polysilicon layer.

Step S200: Form multiple initial active pillars 310 on the substrate 10, where the multiple initial active pillars 310 are arranged in an array.

For example, step S210: Form a second dielectric layer 60 and a first mask layer 70 that are sequentially stacked on the substrate 10.

Figure 9:
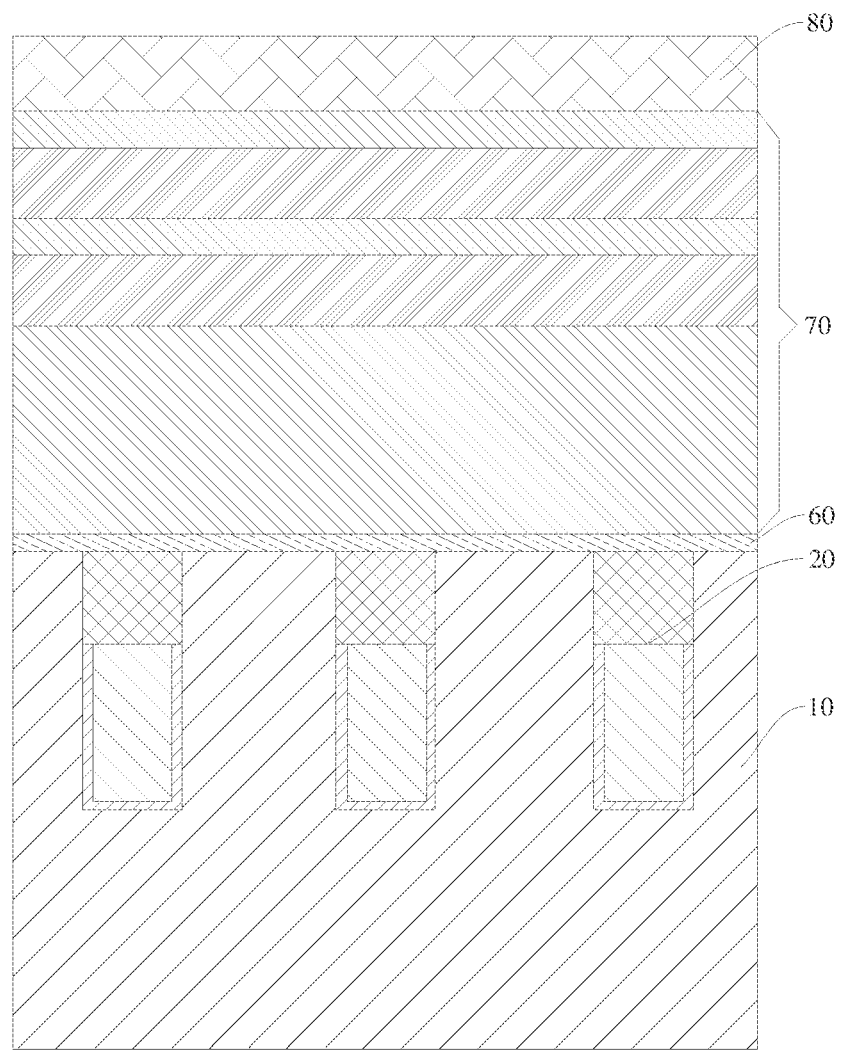
FIG. 9 is a schematic diagram of forming a second dielectric layer and a second mask layer in the method of manufacturing a semiconductor structure according to an exemplary embodiment.

As shown in FIG. 9, the laminated second dielectric layer 60 and first mask layer 70 can be formed on the substrate 10 by an atomic layer deposition process, a chemical vapor deposition process, or a physical vapor deposition process.

The first mask layer 70 may be a single-layer structure or a laminated structure. When the first mask layer 70 is a laminated structure, the first mask layer 70 may include a tetraethoxysilane (TEOS) layer, a spin-coated carbon (SOC) layer, a silicon oxynitride (SiON) layer, a spin-coated carbon (SOC) layer, and a silicon oxynitride (SiON) layer that are sequentially stacked on the second dielectric layer 60.

A material of the second dielectric layer 60 includes silicon nitride or the like.

Step S220: Remove part of the first mask layer 70 and part of the second dielectric layer 60, to form multiple second grooves 200 that are arranged at intervals, where one of the second grooves 200 exposes a top surface of one bit line structure 20.

Figure 10:
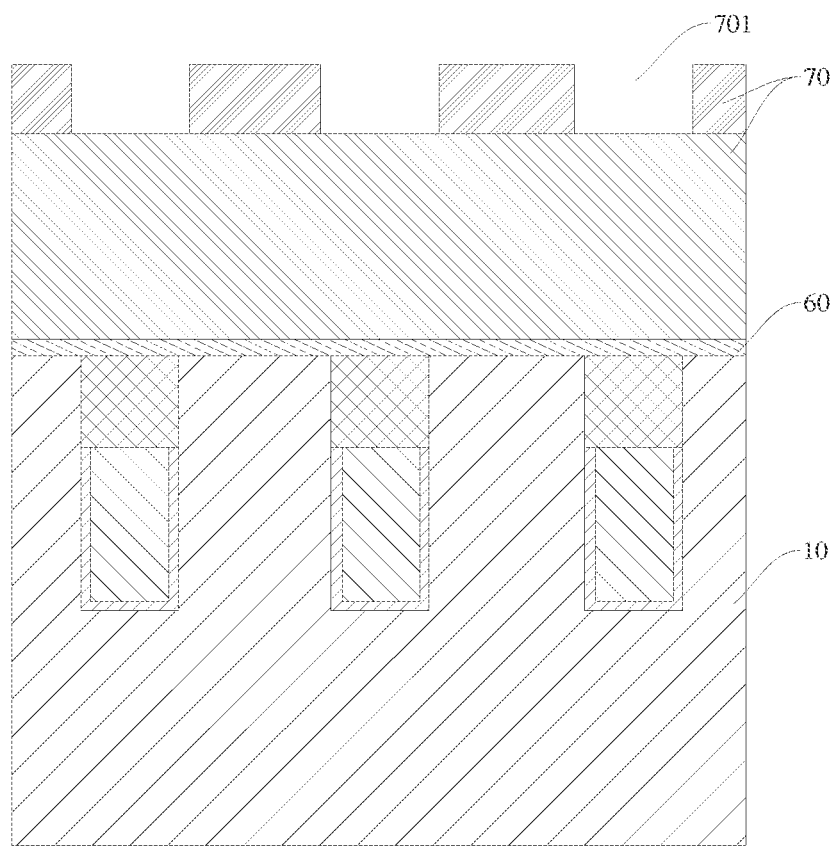
FIG. 10 is a schematic diagram of forming a second mask opening in the method of manufacturing a semiconductor structure according to an exemplary embodiment.

For example, as shown in FIG. 10, the first mask layer 70 may be patterned to form multiple first mask openings 701 that are arranged at intervals along the first direction on the first mask layer 70.

Figure 11:
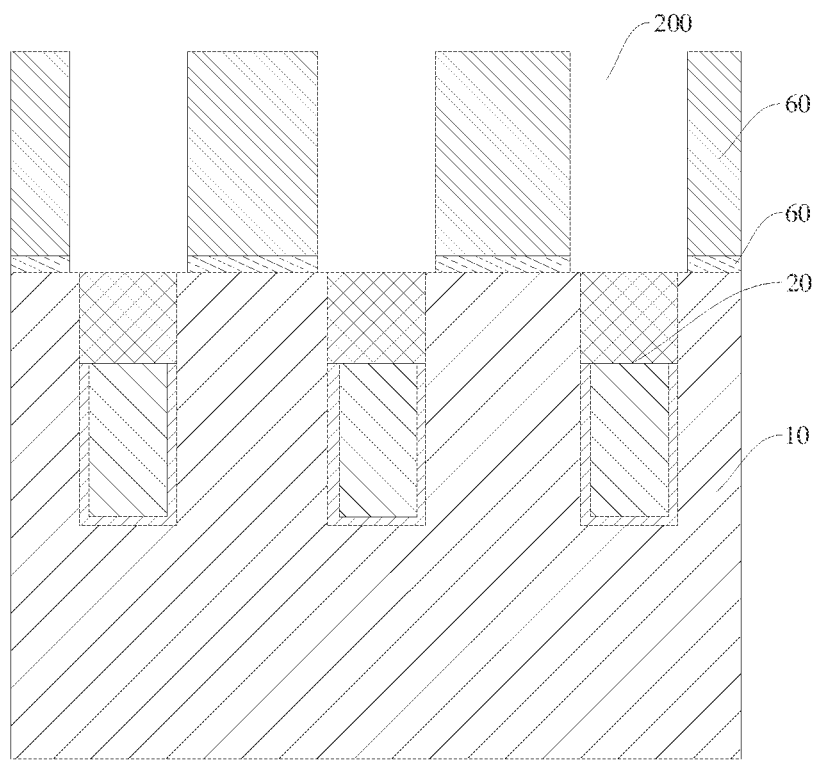
FIG. 11 is a schematic diagram of forming a second groove in the method of manufacturing a semiconductor structure according to an exemplary embodiment.

As shown in FIG. 9 to FIG. 11, a second photoresist layer 80 may be formed on the first mask layer 70, and a first mask pattern is formed on the second photoresist layer 80 by exposure or development etching; part of the first mask layer 70 is removed by using the second photoresist layer 80 with the first mask pattern as a second mask plate to form multiple first mask openings 701 arranged at intervals. A width of the first mask opening 701 is greater than that of the first groove 101.

After the first mask openings 701 are formed, the retained first mask layer 70 and second dielectric layer 60 are etched by using an etching solution or etching gas, and the first mask layer 70 and second dielectric layer 60 exposed in each first mask opening 701 are removed, such that each second groove 200 exposes the top surface of the corresponding bit line structure 20.

Step S221: Form a first oxide layer 90 on sidewalls of each second groove 200, where a top surface of the first oxide layer 90 is flush with a top surface of the retained first mask layer 70.

Figure 12:
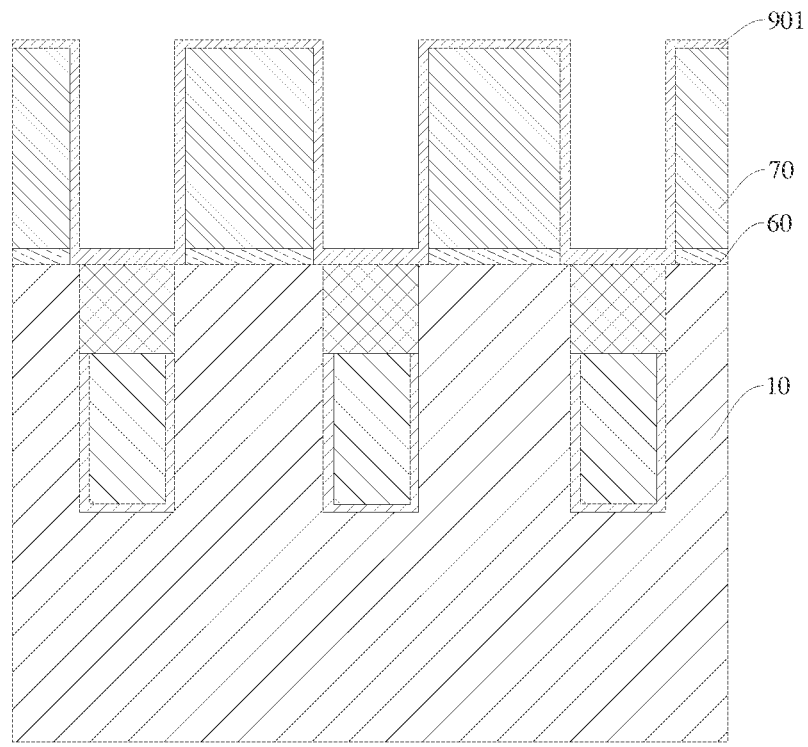
FIG. 12 is a schematic diagram of forming a first initial oxide layer in the method of manufacturing a semiconductor structure according to an exemplary embodiment.

For example, as shown in FIG. 12, the first initial oxide layer 901 can be formed on the inner wall of each second groove 200 by an atomic layer deposition process, and the first initial oxide layer 901 extends to the outside of the second groove 200 and covers the top surface of the retained first mask layer 70. The first initial oxide layer 901 located on the top surface of the first mask layer 70 is removed by wet etching.

Step S222: Remove the first oxide layer 90 at the bottom of the second groove 200 and expose the bit line structure 20.

Figure 13:
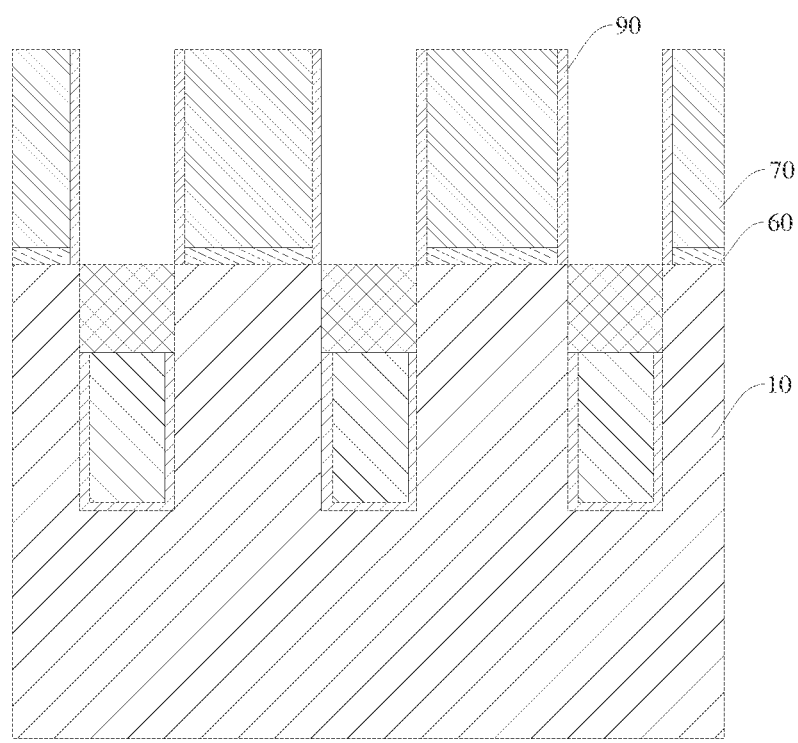
FIG. 13 is a schematic diagram of forming a first oxide layer in the method of manufacturing a semiconductor structure according to an exemplary embodiment.

For example, as shown in FIG. 13, the first initial oxide layer 901 at the bottom of the second groove 200 in step S221 is continued to be etched by wet etching, and the bit line structure 20 is exposed through the second groove 200. The first initial oxide layer 901 retained on the inner wall of the second groove 200 forms the first oxide layer 90.

Step S230: Form an initial active pillar 31 in each second groove 200, where the initial active pillar 31 includes a channel region 31c as well as a source 31a and a drain 31b, the source and the drain are provided at two ends of the channel region 31c respectively.

For example, step S231: Form a silicon pillar 100 in each second groove 200, where dopant ions in the ion-doped polysilicon layer 220 diffuse towards the silicon pillar 100, such that an end of the silicon pillar 100 which faces toward the bit line contact portion 22 forms the drain 31b.

Figure 14:
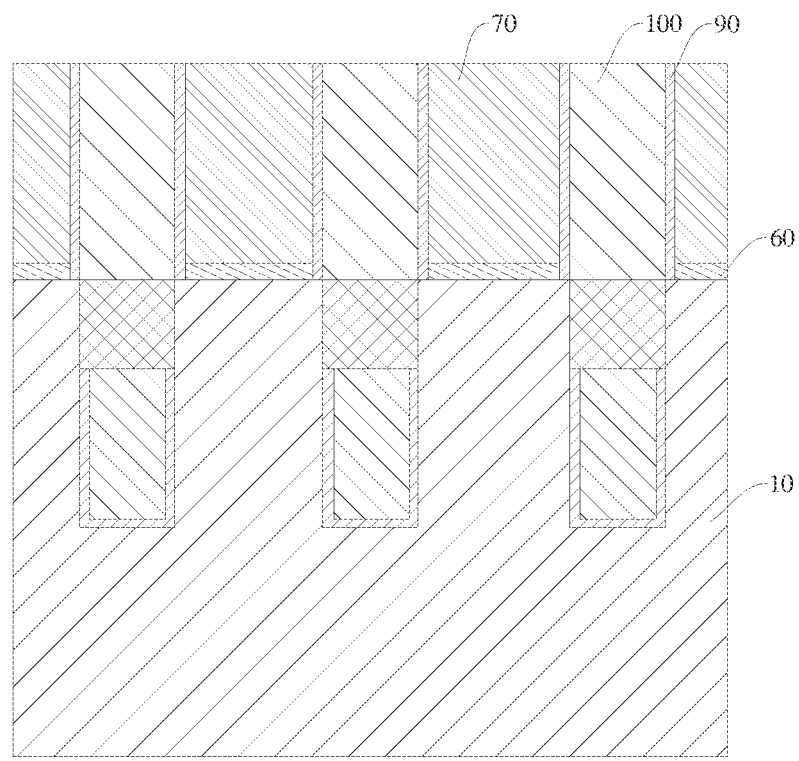
FIG. 14 is a schematic diagram of forming a silicon pillar in the method of manufacturing a semiconductor structure according to an exemplary embodiment.

As shown in FIG. 14, the silicon pillar 100 can be formed in the second groove 200 by a chemical vapor deposition process or a physical vapor deposition process. Then, dopant ions in the ion-doped polysilicon layer 220 in the bit line structure 20 diffuse towards one end of the silicon pillar 100 by an annealing and diffusion process such that the end of the silicon pillar 100 forms the drain 31b, to facilitate connection of the drain 31b to the bit line contact portion 22.

Step S232: Dope an end of the silicon pillar 100 which is away from the bit line contact portion 22 with ions to form the source 31a.

Figure 15:
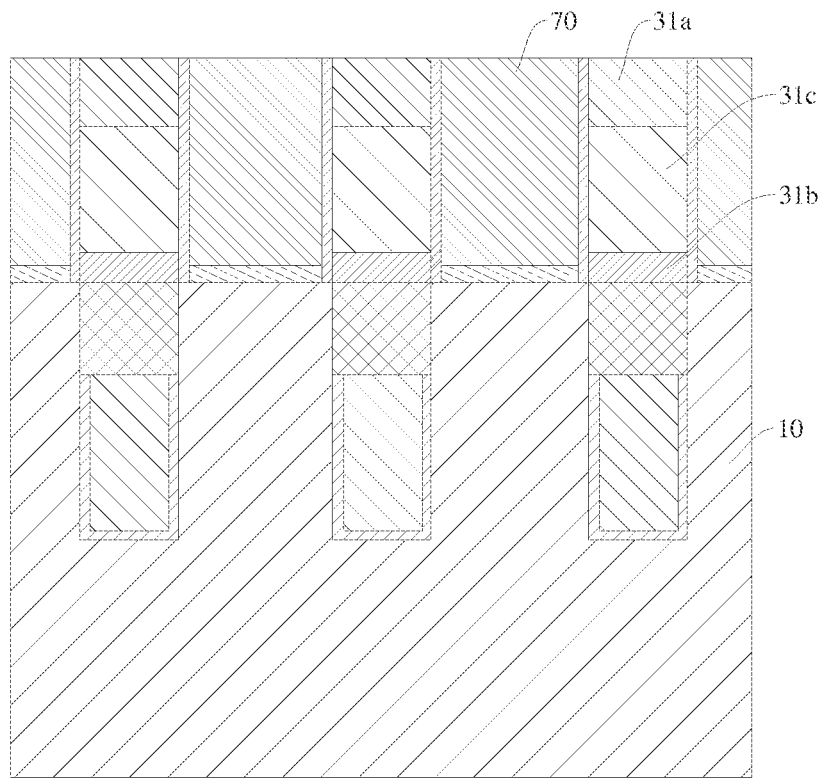
FIG. 15 is a schematic diagram of forming an initial active pillar in the method of manufacturing a semiconductor structure according to an exemplary embodiment.

For example, as shown in FIG. 15, an end of the silicon pillar 100 which is away from the bit line contact portion 22 may be doped with ions by ion injection to form the source 31a, so as to facilitate connection of the source 31a to a component such as a capacitor. A region, which is located between the source 31a and the drain 31b, of the silicon pillar 100 forms the channel region 31c of the initial active pillar 31.

The first direction is a row arrangement extension direction of the initial active pillars 31 arranged in an array.

Step S300: Form a gate layer 40 between initial active pillars 31, where the gate layer 40 is connected to sidewalls of each initial active pillar 31.

For example, step S310: Remove the first mask layer 70 and the first oxide layer 90 to form a filling region 41, where the filling region 41 exposes a peripheral surface of the initial active pillar 31.

Figure 16:
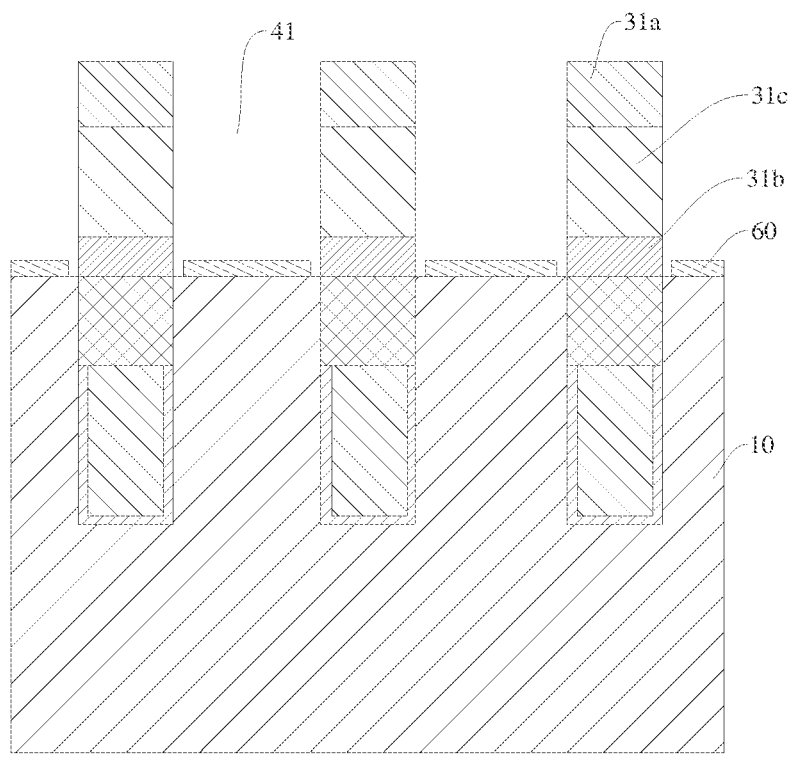
FIG. 16 is a schematic diagram of forming a filling region in the method of manufacturing a semiconductor structure according to an exemplary embodiment.

As shown in FIG. 16, the first mask layer 70 and the first oxide layer 90 can be removed by cleaning or dry etching.

Step S320: Form a second oxide layer 110 in the filling region 41, where the second oxide layer 110 wraps around an outer surface of the initial active pillar 31 and is connected to the retained second dielectric layer 60, and the second oxide layer 110 and the retained second dielectric layer 60 define a third groove 42.

Figure 17:
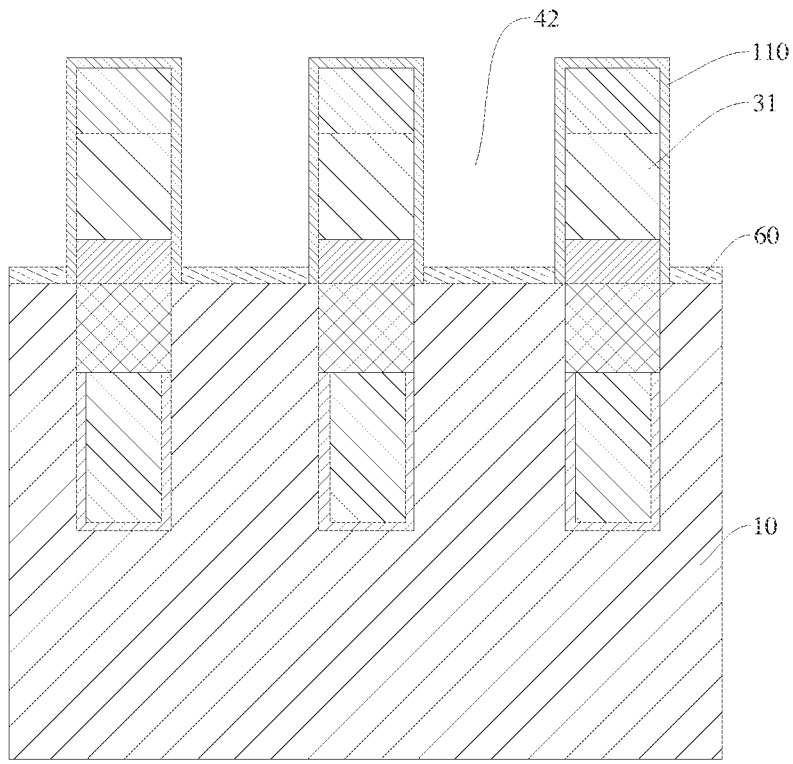
FIG. 17 is a schematic diagram of forming a third groove in the method of manufacturing a semiconductor structure according to an exemplary embodiment.

As shown in FIG. 17, a second oxide layer 110 can be formed on the outer surface of the initial active pillar 31 by an atomic layer deposition process. It should be noted that, the second oxide layer 110 is a gate oxide layer.

Step S330: Form a second barrier layer 410 on an inner wall of the third groove 42, and form a second conductive layer 420 in a region enclosed by the second barrier layer 410, where a top surface of the second conductive layer 420 is flush with a top surface of the second barrier layer 410.

Figure 18:
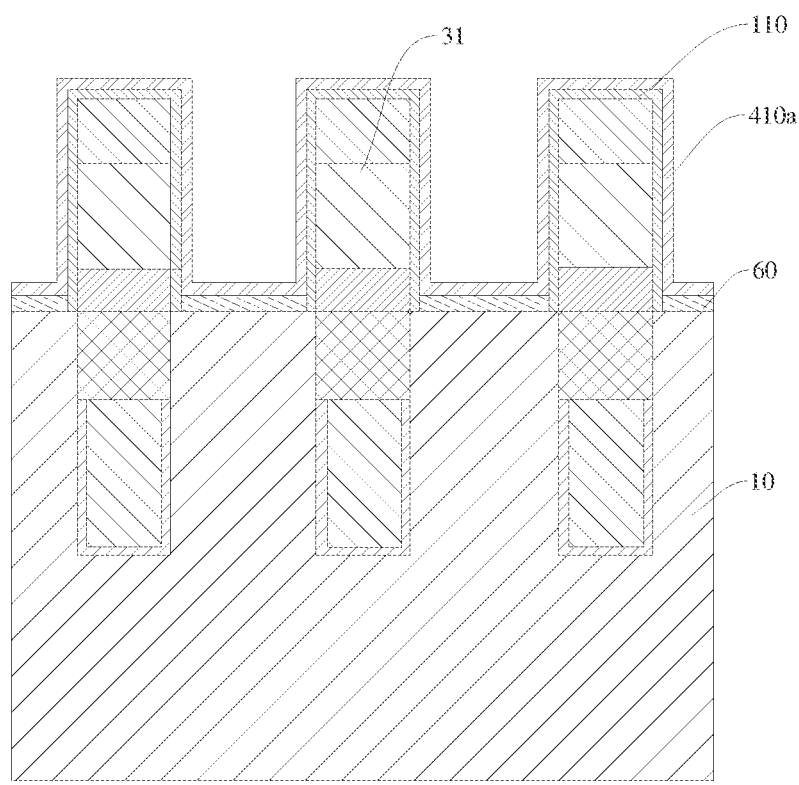
FIG. 18 is a schematic diagram of forming a second initial barrier layer in the method of manufacturing a semiconductor structure according to an exemplary embodiment.
Figure 19:
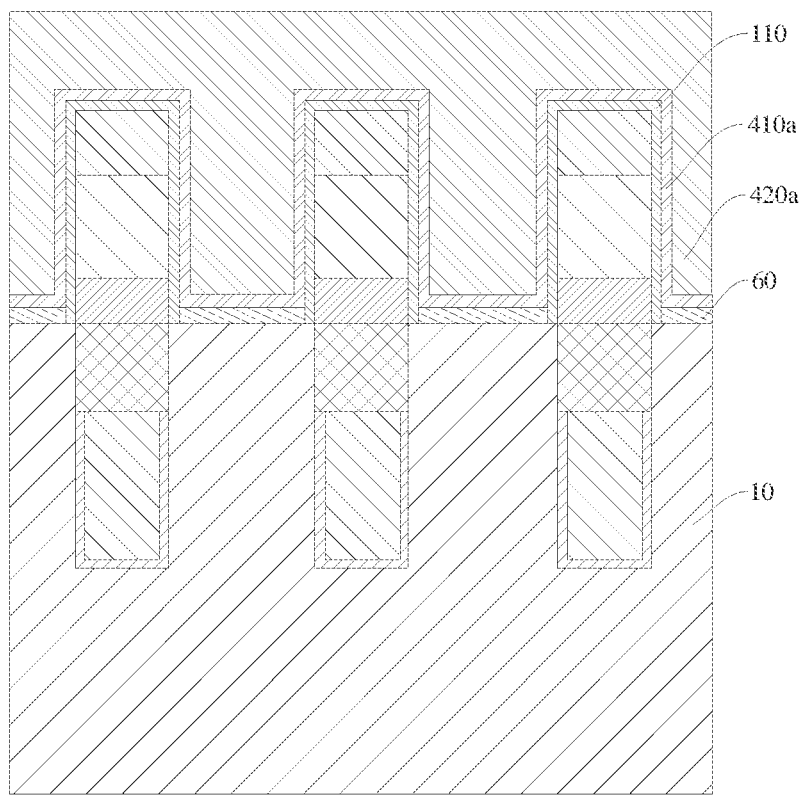
FIG. 19 is a schematic diagram of forming a second initial conductive layer in the method of manufacturing a semiconductor structure according to an exemplary embodiment.
Figure 20:
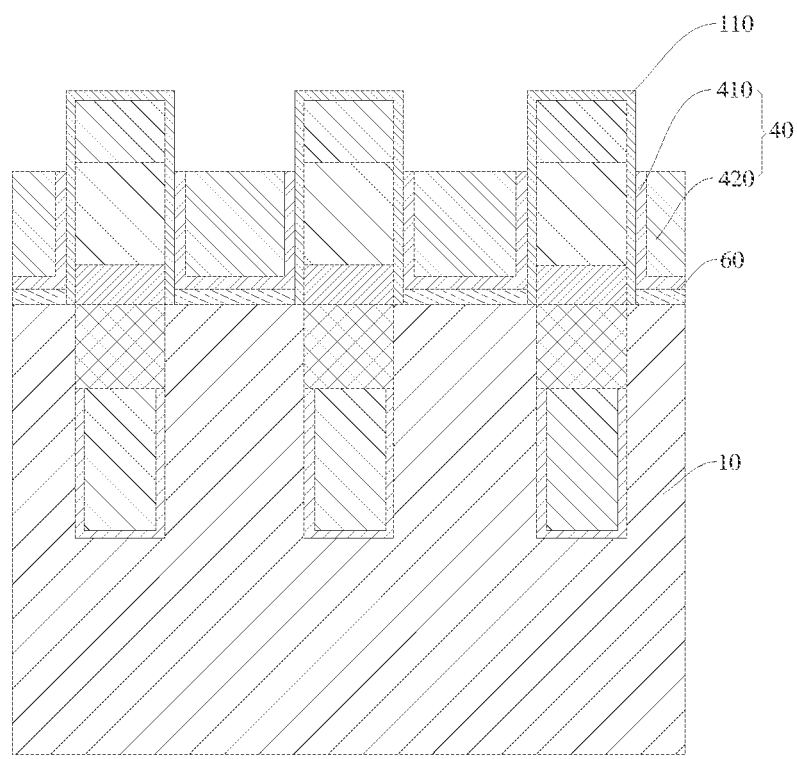
FIG. 20 is a schematic diagram of forming a gate layer in the method of manufacturing a semiconductor structure according to an exemplary embodiment.

For example, as shown in FIG. 18 to FIG. 20, the second initial barrier layer 410a can be formed on the inner wall of the third groove 42 by an atomic layer deposition process; the second initial barrier layer 410a extends to the outside of the third groove 42 and covers the second oxide layer 110 and the top surface of the retained second dielectric layer 60.

Afterwards, the second initial conductive layer 420a can be deposited on the second initial barrier layer 410a by an atomic layer deposition process, and a deposition height of the second initial conductive layer 420a exceeds a predetermined height of the second initial barrier layer 410a deposited on the top surface of the active pillar 31.

Afterwards, the second initial conductive layer 420a and the second initial barrier layer 410a can be removed by a certain thickness through wet etching. The second initial barrier layer 410a retained in the third groove 42 forms the second barrier layer 410, and the second initial conductive layer 420a retained on the second barrier layer 410 forms the second conductive layer 420. The top of the second conductive layer 420 is flush with the top of the second barrier layer 410 along a height extension direction of the substrate 10. The second barrier layer 410 and the second conductive layer 420 form a gate layer 40; the gate layer 40 is connected to the sidewalls of the initial active pillar 31 and is provided on both sides of the sidewalls of the initial active pillar 31.

A material of the second barrier layer 410 includes a conductive material such as titanium nitride; the second barrier layer 410 is conductive and can also prevent a conductive material in a subsequently formed second conductive layer 420 from diffusing into the substrate. A material of the second conductive layer 420 includes a conductive material such as tungsten.

Step S400: Form a first dielectric layer 120 on the gate layer 40 and on the initial active pillars 31.

Figure 21:
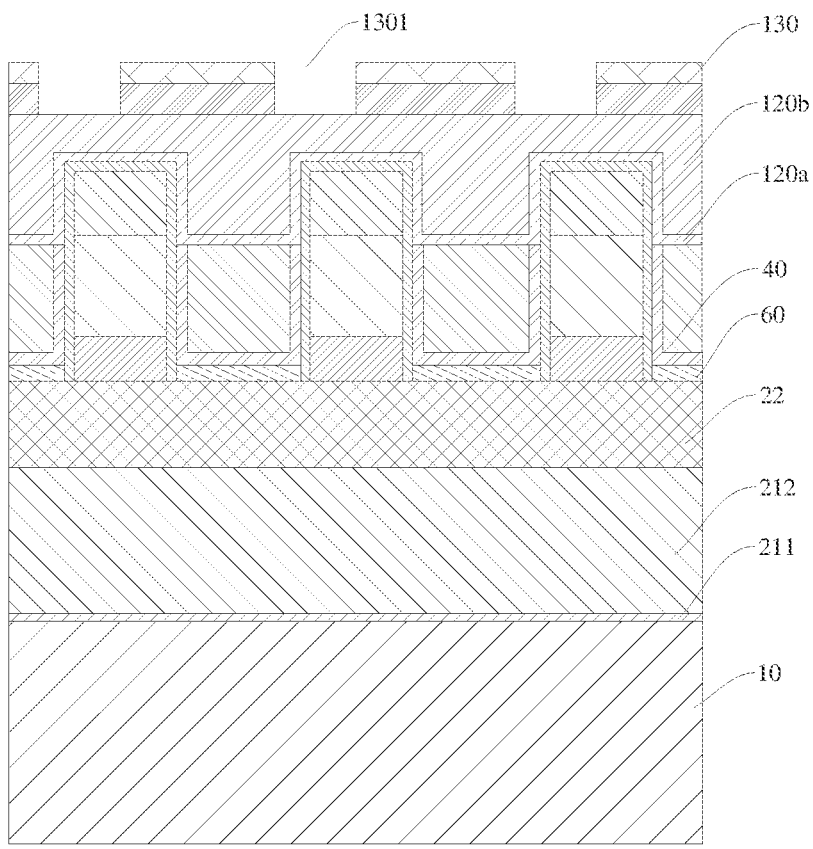
FIG. 21 is a schematic diagram of forming a second mask layer and a second mask opening in the method of manufacturing a semiconductor structure according to an exemplary embodiment.

For example, as shown in FIG. 21, the first dielectric layer 120 can be formed on the gate layer 40 and the initial active pillars 31 by an atomic layer deposition process, a chemical vapor deposition process, and a physical vapor deposition process. A deposition height of the first dielectric layer 120 is higher than a predetermined height of the initial active pillar 31 along the height extension direction of the substrate.

A material of the first dielectric layer 120 includes a laminated silicon nitride layer 120a and TEOS layer 120b.

Step S500: Form, in the first dielectric layer 120, openings 300 extending along a row arrangement direction of the initial active pillars 31, where projection of one of the openings 300 on the substrate 10 partially overlaps with projection of each of the initial active pillars 31 in the same row on the substrate 10, and projection, which does not overlap with the projection of the opening 300 on the substrate 10, of two adjacent initial active pillars 31 in the same row on the substrate 10 are located on two sides of the opening 300 respectively.

For example, as shown in FIG. 21, step S510: Form a second mask layer 130 on the first dielectric layer 120.

The second mask layer 130 can be formed on the first dielectric layer 120 by an atomic layer deposition process, a chemical vapor deposition process, or a physical vapor deposition process.

Figure 22:
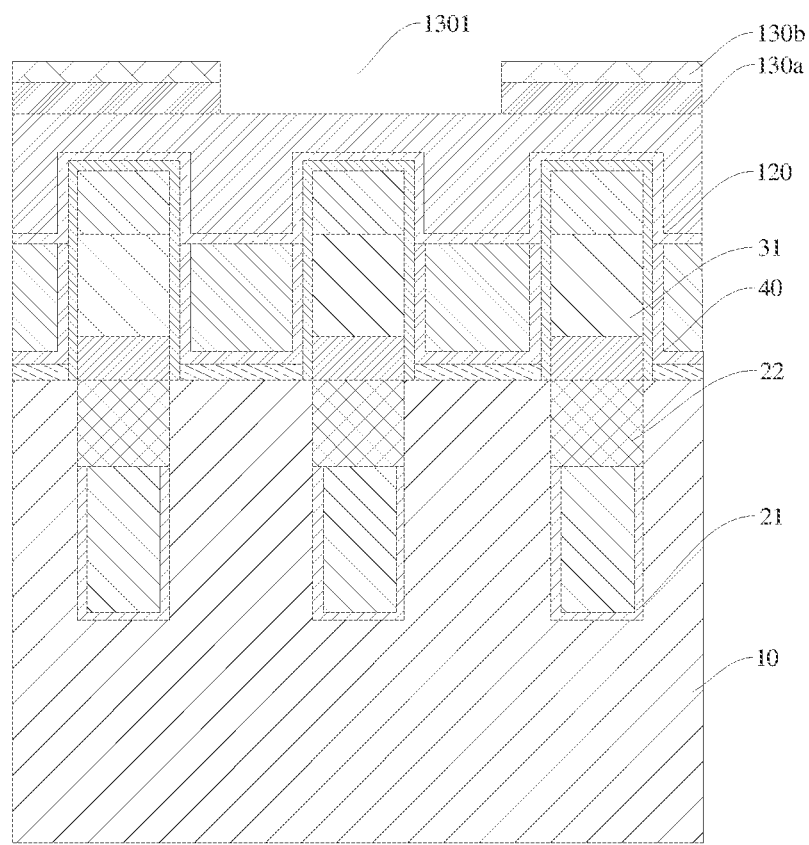
FIG. 22 is a cross-sectional view taken along a longitudinal direction in FIG. 21.

The second mask layer 130 may be a single-layer structure or a laminated structure. When the second mask layer 130 is a laminated structure, as shown in FIG. 21 and FIG. 22, the second mask layer 130 may include a spin-coated carbon (SOC) layer 130a and a silicon oxynitride (SiON) layer 130b sequentially stacked on the first dielectric layer 120.

Step S520: Pattern the second mask layer 130 to form multiple opening regions on the second mask layer 130, where the opening regions are arranged at intervals along a row arrangement extension direction of the initial active pillars 31.

A third photoresist layer can be formed on the second mask layer 130, and a second mask pattern can be formed on the third photoresist layer by exposure or development etching; part of the second mask layer is removed by using the third photoresist layer with the second mask pattern as a mask plate, to form multiple second mask openings 1301 arranged at intervals.

In this embodiment, by transferring the second mask pattern to the second mask layer 130 and then etching the second mask layer 130 by using the second mask layer as the mask plate, the accuracy of the pattern transfer and the performance of the semiconductor structure can be improved.

After the second mask openings 1301 are formed, the second mask layer 130 exposed in each second mask opening 1301 is removed by using an etching solution or etching gas to form multiple opening regions on the second mask layer.

Step S530: Form, in the first dielectric layer 120, openings 300 extending along a row arrangement direction of the initial active pillars 31.

Figure 23:
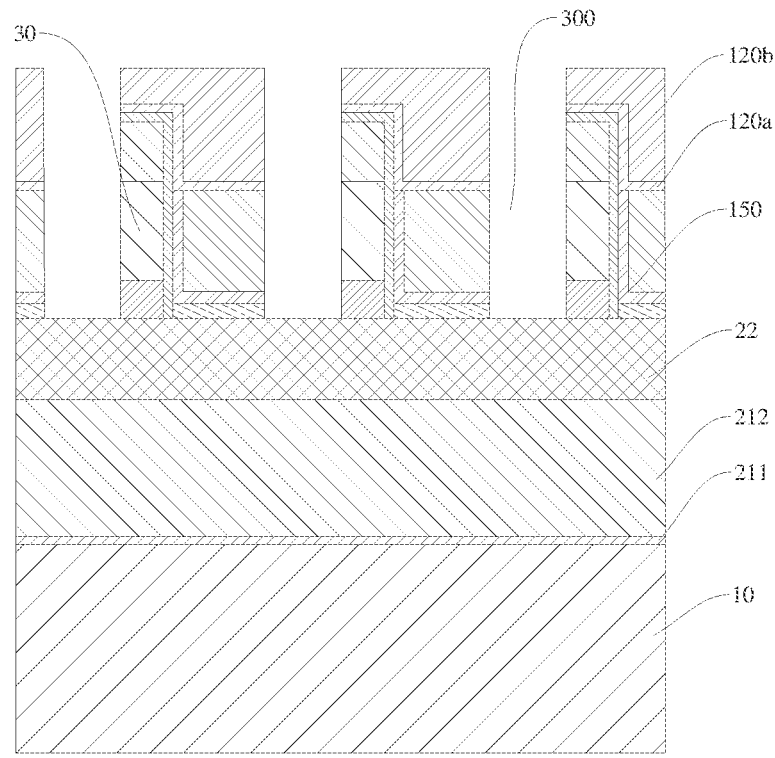
FIG. 23 is a schematic diagram of forming an opening in the method of manufacturing a semiconductor structure according to an exemplary embodiment.
Figure 24:
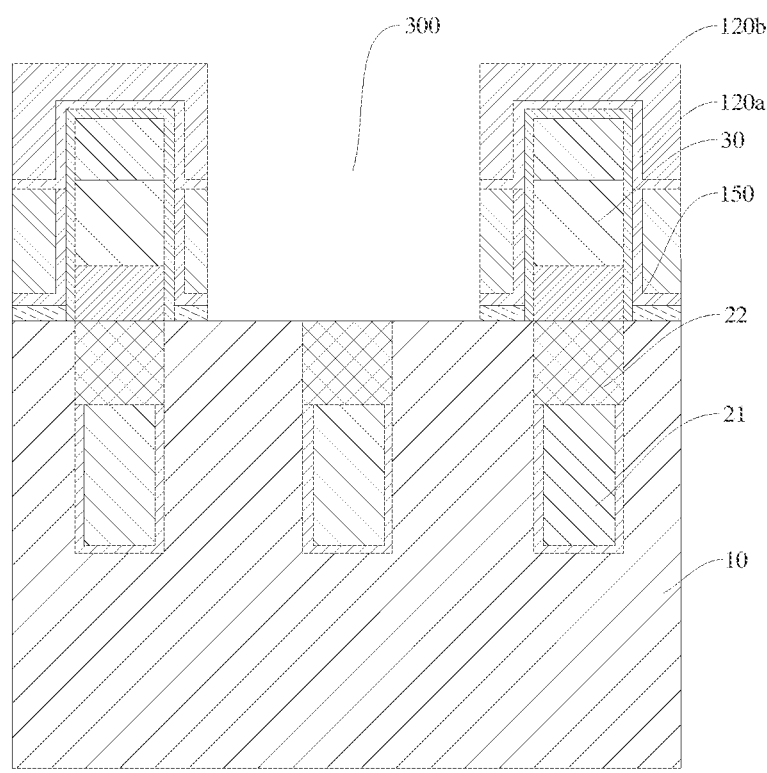
FIG. 24 is a cross-sectional view taken along a longitudinal direction in FIG. 23.

For example, as shown in FIG. 23 and FIG. 24, the second mask layer 130 is removed, and the first dielectric layer 120 exposed in each opening region is removed to form, in the first dielectric layer 120, the opening 300 extending along the row arrangement direction of the initial active pillars 31. The projection of the opening on the substrate 10 partially overlaps with the projection of each of the initial active pillars 31 on the substrate 10 in the same row. Moreover, projection, which does not overlap with the projection of the opening 300 on the substrate 10, of two adjacent initial active pillars 31 in the same row on the substrate 10 are located on two sides of the opening 300 respectively Step S600: Remove the initial active pillar 31 exposed in each opening 300 to form an active pillar 30; and remove the gate layer 40 exposed in each opening 300 to form an isolation trench 140 and a word line 150, where two adjacent active pillars 30 in the same row are located on two sides of the isolation trench 140.

Figure 26:
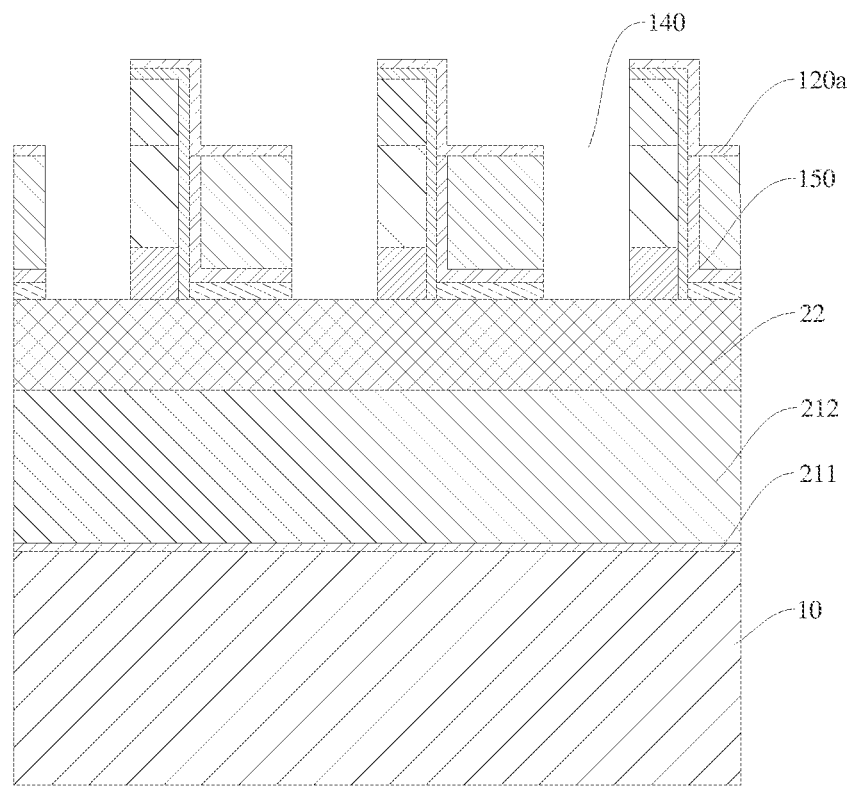
FIG. 26 is a schematic diagram along direction a-a in FIG. 25.
Figure 27:
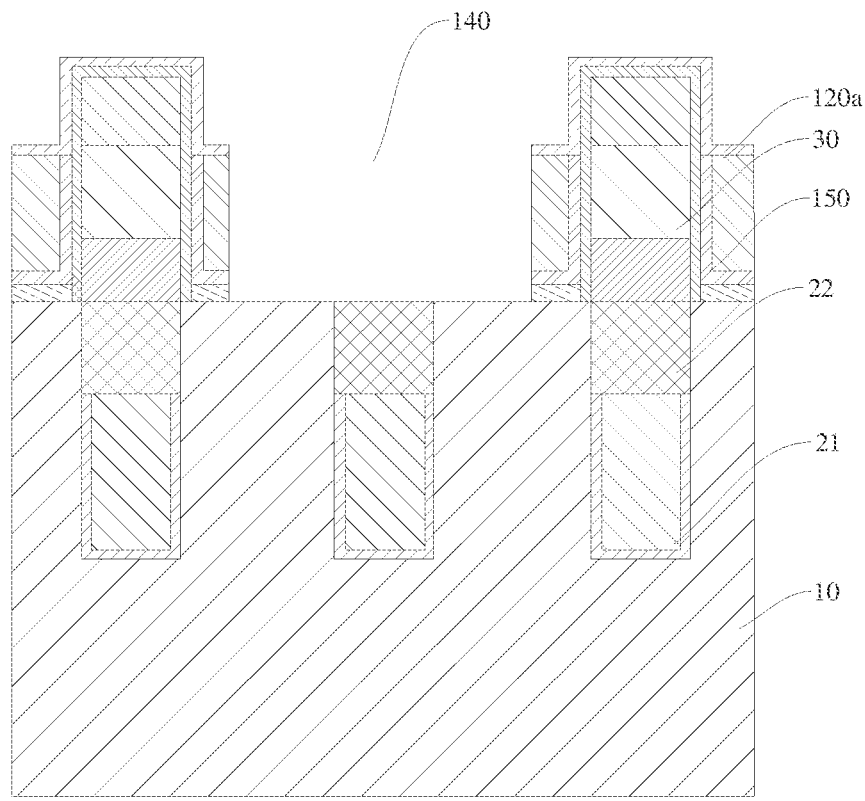
FIG. 27 is a schematic diagram along direction b-b in FIG. 25.
Figure 33:
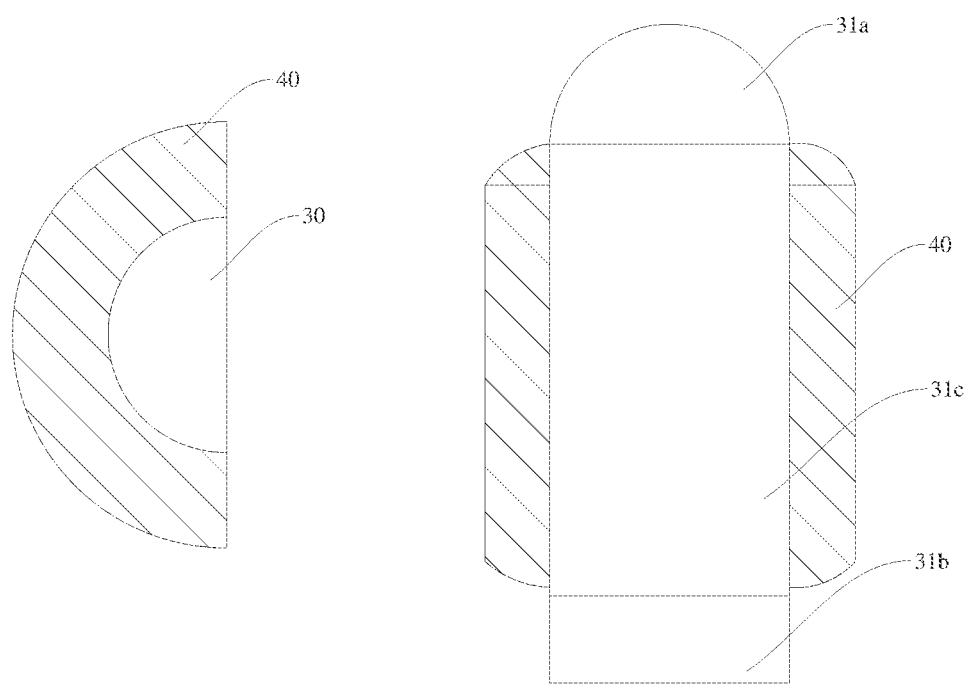
FIG. 33 is a schematic diagram of an active pillar in a semiconductor structure according to an exemplary embodiment.

For example, as shown in FIG. 26, FIG. 27 and FIG. 33, part of the first dielectric layer 120 can be removed by wet etching. Etching is performed downwards continuously, to remove the initial active pillar 31 exposed in the opening 300, and the retained initial active pillar 31 forms the active pillar 30. The gate layer 40 in the opening 300 is removed. A region between two adjacent active pillars 31 in the same column forms the isolation trench 140 between two adjacent rows of active pillars 30, while the finally retained second barrier layer 410 and finally retained second conductive layer 420 form the word line 150. Two adjacent active pillars 31 in the same row are located on two sides of the isolation trench 140.

Figure 25:
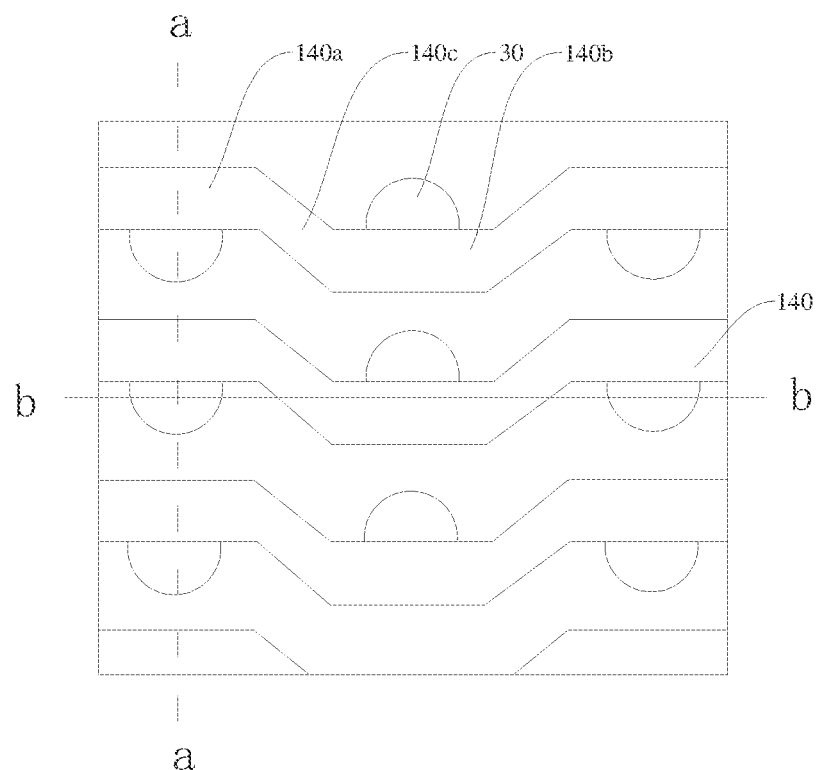
FIG. 25 is a schematic diagram of forming an isolation trench in the method of manufacturing a semiconductor structure according to an exemplary embodiment.

FIG. 25 shows the shape of the projection of the isolation trench 140 on the substrate 10. The isolation trench 140 includes at least one first segment 140a, at least one second segment 140b, and at least one third segment 140c.

Along the arrangement direction of the active pillars 30 in the same row, the first segment 140a and the second segment 140b are sequentially arranged in a staggered manner, and the third segment 140c is used for connecting the first segment 140a and the second segment 140b that are adjacent to each other. Two adjacent active pillars 30 in the same row are respectively located on different sides of the first segment 140a and the second segment 140b, and a third segment 140c is provided between two adjacent active pillars 30 in the same row. That is, two adjacent active pillars 30 in the same row are separated on two sides of the isolation trench 140.

In this embodiment, with a plane parallel to the substrate 10 as a cross section, a cross-sectional shape of the active pillar 30 includes an arc segment and a straight-line segment connected to an end portion of the arc segment, an arc opening of the arc segment faces toward the isolation trench 140, and the straight-line segment is adjacent to a boundary of the isolation trench 140. The arc shape of the arc segment on the active pillar 30 can be a superior arc or a semicircular arc. This increases the spacing between two active pillars 30 located in the same column on adjacent word lines, thereby reducing the signal interference between adjacent word lines and improving the performance of the semiconductor structure.

It should be noted that, after the step of forming the isolation trench 140 and the word line 150, the method may further include forming an isolation structure 160 in the isolation trench 140, where the isolation structure 160 extends to the outside of the isolation trench 140 and covers the gate layer 40 and the active pillar 30. Formation of the isolation structure 160 in the isolation trench 140 includes the following steps:

Step S710: Fill the isolation trench 140 with an isolation material 170.

Figure 28:
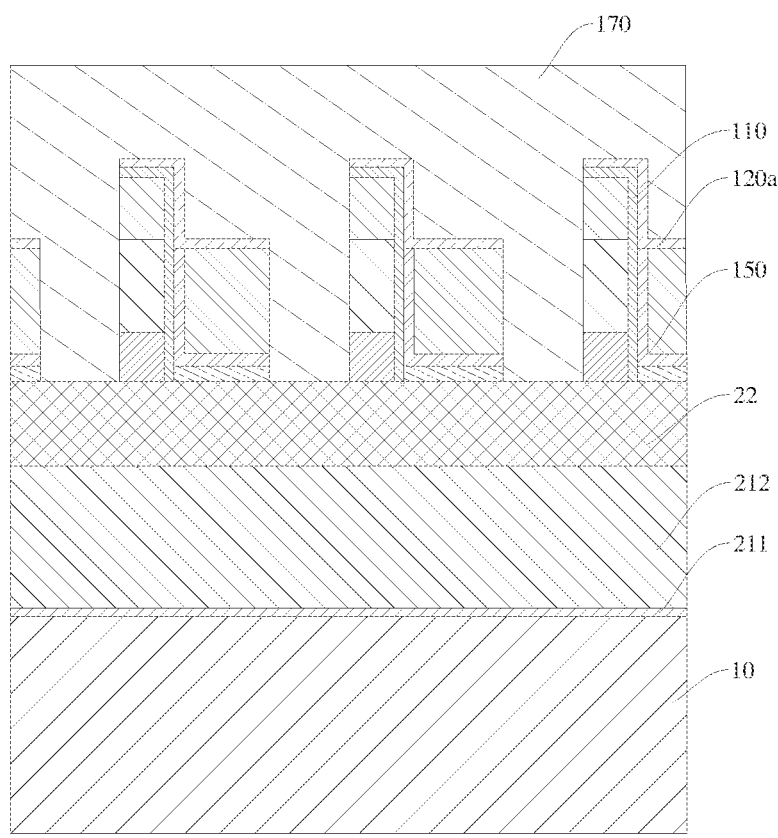
FIG. 28 is a schematic diagram of forming an isolation material in the method of manufacturing a semiconductor structure according to an exemplary embodiment.
Figure 29:
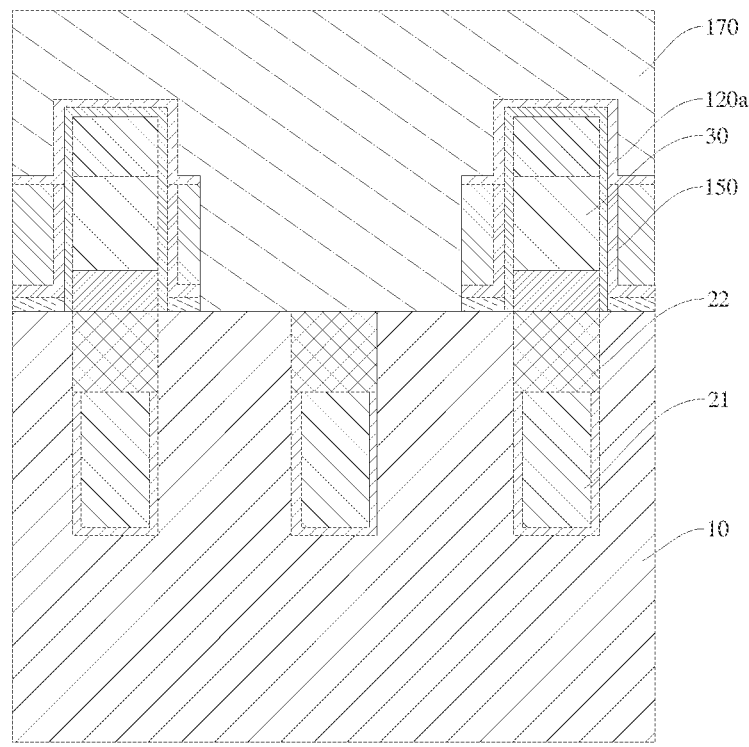
FIG. 29 is a cross-sectional view taken along a longitudinal direction in FIG. 28.

For example, as shown in FIG. 28 and FIG. 29, the isolation material 170 may be deposited in the isolation trench 140 by an atomic layer deposition process, a chemical vapor deposition process, or a physical vapor deposition process, and a deposition thickness of the isolation material 170 is higher than a predetermined height of the active pillar 30 along the height extension direction of the substrate 10.

Step S720: Remove part of the isolation material 170, part of the first dielectric layer 120, and part of the second oxide layer 110 to form the isolation structure 160.

Figure 30:
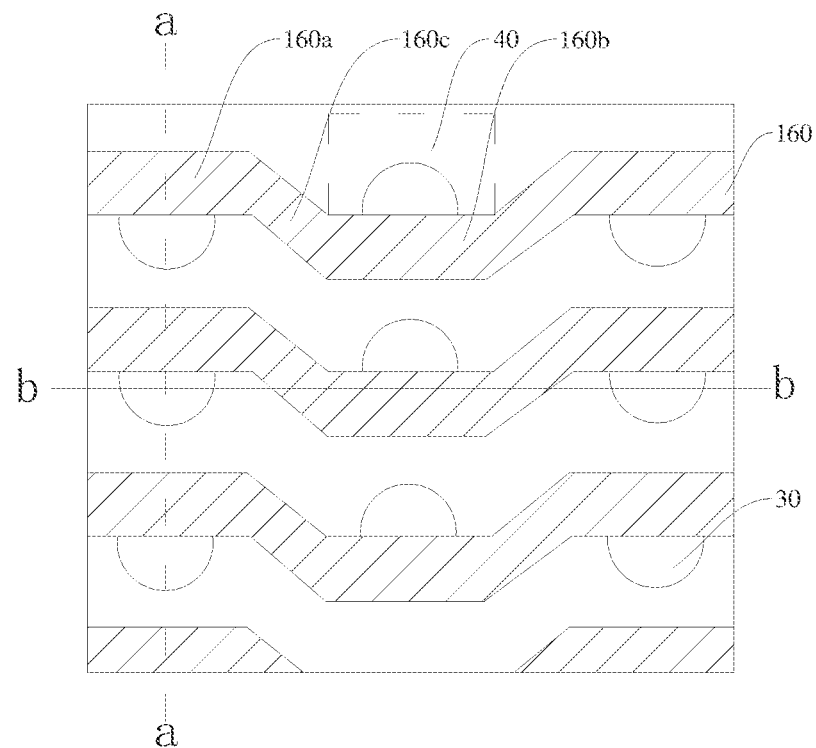
FIG. 30 is a schematic top view of a semiconductor structure according to an exemplary embodiment.
Figure 31:
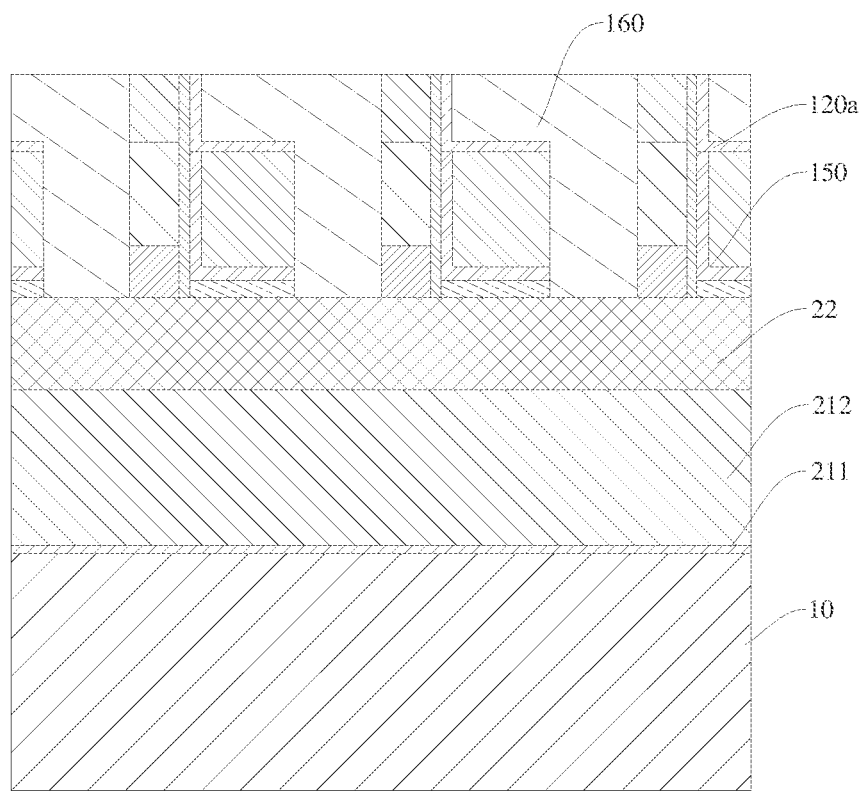
FIG. 31 is a schematic diagram along direction a-a in FIG. 30 (schematic diagram of forming an isolation structure)
Figure 32:
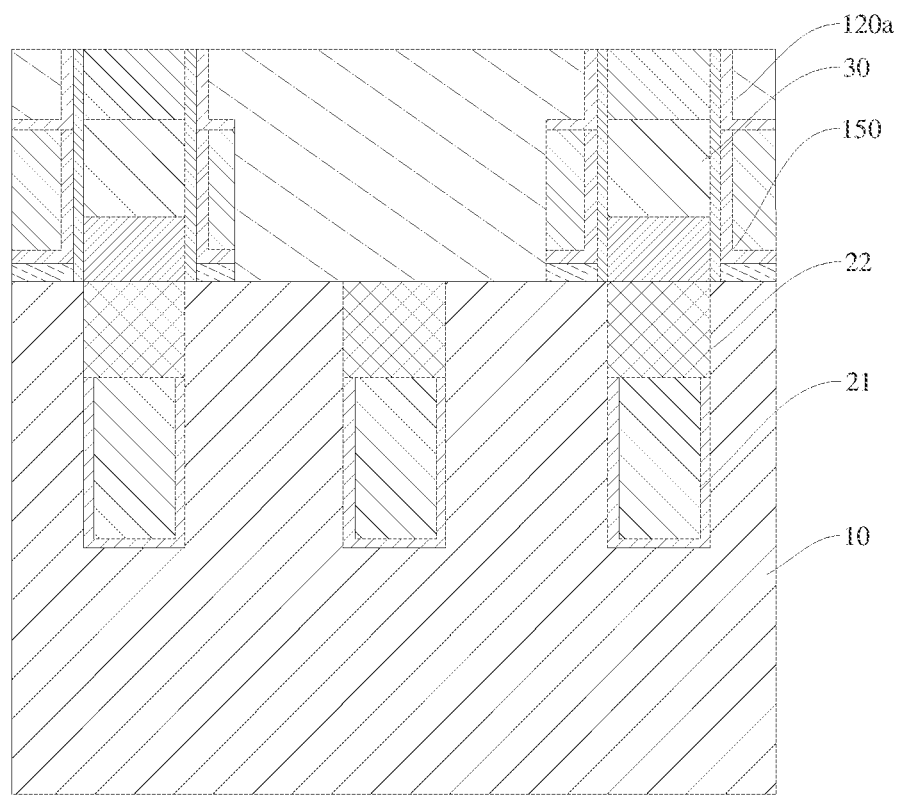
FIG. 32 is a schematic diagram along direction b-b in FIG. 30 (schematic diagram of forming an isolation structure)

For example, as shown in FIG. 30 to FIG. 32, part of the isolation material 170, part of the first dielectric layer 120, and part of the second oxide layer 110 on the top surface of the source 31a of the active pillar 30 can be removed by wet etching along the direction from the source 31a to the drain 31b of the active pillar 30, to expose the source 31a of the active pillar 30 for connection to a device such as a capacitor tube.

As shown in FIG. 30 and FIG. 33, an embodiment of the present disclosure further provides a semiconductor structure, including:

a substrate 10;

multiple active pillars 30, where the multiple active pillars 30 are arranged on the substrate 10 in an array; and multiple isolation structures 160 provided on the substrate 10, where each of the isolation structures 160 includes a first side and a second side that are arranged opposite to each other, the isolation structure 160 extends along an arrangement direction of the active pillars 30 in the same row, such that two adjacent active pillars 30 in the same row are separated on two opposite sides of the isolation structure 160.

As shown in FIG. 33, with a surface parallel to the substrate 10 as a cross section, a cross-sectional shape of the active pillar 30 includes an arc segment and a straight-line segment connected to an end portion of the arc segment, where the arc segments of the active pillars 30 in the same column have the same orientation, and the arc segments of the active pillars 30 in two adjacent columns have opposite orientations. The arc shape of the arc segment on the active pillar 30 can be a superior arc or a semicircular arc.

The isolation structure 160 includes at least one first isolation segment 160a, at least one second isolation segment 160b, and at least one third isolation segment 160c. The first isolation segment and the second isolation segment are sequentially arranged in a staggered manner, and the third isolation segment is used for connecting the first isolation segment and the second isolation segment that are adjacent to each other; in two adjacent active pillars 30 in the same row, one active pillar is located on one side of the first isolation segment 160a, and the other active pillar 30 is located on the other side of the second isolation segment 160b.

That is, two adjacent active pillars 30 in the same row are separated on two sides of the isolation structure 160, which increases the spacing between two active pillars in the same column on adjacent word lines, thereby reducing the signal interference between adjacent word lines and improving the performance of the semiconductor structure.

As shown in FIG. 31 and FIG. 32, the semiconductor structure further includes multiple bit line structures 20 in the substrate 10, and each of the bit line structures 20 extends along an arrangement direction of the active pillars 30 in the same column, where the top of the bit line structure 20 is connected to the bottom of the active pillar 30.

The bit line structure 20 includes a bit line 21 and a bit line contact portion 22 provided on the bit line 21; the bit line includes a first conductive layer 212 and a first barrier layer 211 wrapping around the first conductive layer 212; and the bit line contact portion 22 is located above the first conductive layer 212 and is connected to the first conductive layer 212, and a top surface of the bit line contact portion 22 is flush with a top surface of the substrate 10. The bit line contact portion 22 is connected to the drain 31b of the active pillar 30; the source 31a of the active pillar 30 may be connected to a component such as a capacitor; a region between the drain 31b and the source 31a of the active pillar 30 is a channel region 31c, and a semi-circular gate layer is formed on the channel region 31c.

As shown in FIG. 31 and FIG. 32, the semiconductor structure further includes multiple word lines 150 that are located between the isolation structures 160 and extend along the same direction as the isolation structures 160, and each of the word lines 150 is connected to the active pillar 30 between the isolation structures 160 which are adjacent to the word line.

Each embodiment or implementation in the specification of the present disclosure is described in a progressive manner. Each embodiment focuses on the difference from other embodiments, and the same and similar parts between the embodiments may refer to each other.

In the description of the specification, the description with reference to terms such as "an embodiment", "an illustrative embodiment", "some implementations", "an illustrative implementation" and "an example" means that the specific feature, structure, material or feature described in combination with the implementation(s) or example(s) is included in at least one implementation or example of the present disclosure.

In this specification, the schematic expression of the above terms does not necessarily refer to the same implementation or example. Moreover, the described specific feature, structure, material or characteristic may be combined in an appropriate manner in any one or more implementations or examples.

It should be noted that in the description of the present disclosure, the terms such as "center", "top", "bottom", "left", "right", "vertical", "horizontal", "inner" and "outer" indicate the orientation or position relationships based on the drawings. These terms are merely intended to facilitate description of the present disclosure and simplify the description, rather than to indicate or imply that the mentioned device or element must have a specific orientation and must be constructed and operated in a specific orientation. Therefore, these terms should not be construed as a limitation to the present disclosure.

It can be understood that the terms such as "first" and "second" used in the present disclosure can be used to describe various structures, but these structures are not limited by these terms. Instead, these terms are merely intended to distinguish one element from another.

The same elements in one or more drawings are denoted by similar reference numerals. For the sake of clarity, various parts in the drawings are not drawn to scale. In addition, some well-known parts may not be shown. For the sake of brevity, the structure obtained by implementing multiple steps may be shown in one figure. In order to make the understanding of the present disclosure more clearly, many specific details of the present disclosure, such as the structure, material, size, processing process and technology of the device, are described below. However, as those skilled in the art can understand, the present disclosure may not be implemented according to these specific details.

Finally, it should be noted that the above embodiments are merely intended to explain the technical solutions of the present disclosure, rather than to limit the present disclosure. Although the present disclosure is described in detail with reference to the above embodiments, those skilled in the art should understand that they may still modify the technical solutions described in the above embodiments, or make equivalent substitutions of some or all of the technical features recorded therein, without deviating the essence of the corresponding technical solutions from the scope of the technical solutions of the embodiments of the present disclosure.

INDUSTRIAL APPLICABILITY

In the method of manufacturing a semiconductor structure and the semiconductor structure provided in the embodiments of the present disclosure, two adjacent active pillars in the same row are separated on two sides of the isolation structure, which increases the spacing between two active pillars in the same column on adjacent word lines, thereby reducing the signal interference between adjacent word lines and improving the performance of the semiconductor structure.

The invention claimed is:

1. A method of manufacturing a semiconductor structure, comprising:
    providing a substrate;
    forming multiple initial active pillars on the substrate, wherein the multiple initial active pillars are arranged in an array;
    forming a gate layer between the initial active pillars, wherein the gate layer is connected to sidewalls of each initial active pillar;
    forming a first dielectric layer on the gate layer and on the initial active pillars;
    forming, in the first dielectric layer, openings extending along a row arrangement direction of the initial active pillars; wherein a projection of one of the openings on the substrate partially overlaps with a projection of each of the initial active pillars in the same row on the substrate, and another projection, which does not overlap with the projection of one of the openings on the substrate, of two adjacent initial active pillars in the same row on the substrate is located on two sides of one of the openings respectively;
    removing the initial active pillar exposed in each opening to form an active pillar; and removing the gate layer exposed in each opening to form an isolation trench and a word line, wherein two adjacent active pillars located in the same row are located on two sides of the isolation trench; and
    forming an isolation structure in the isolation trench, wherein the isolation structure extends out of the isolation trench and covers the gate layer and the active pillar, the isolation structure comprises a first side and a second side that are provided opposite to each other, the isolation structure extends along an arrangement direction of the active pillars in the same row, such that two adjacent active pillars in the same row are separated on two sides of the isolation structure;
    wherein after the step of providing a substrate, and before the step of forming multiple initial active pillars on the substrate, the method of manufacturing a semiconductor structure further comprises:
    forming multiple bit line structures in the substrate, wherein the multiple bit line structures are arranged at intervals on the substrate along a row direction of the active pillars, each of the bit line structures comprises a bit line and a bit line contact portion provided on the bit line, and a top surface of the bit line contact portion is flush with a top surface of the substrate;
    wherein the step of forming multiple initial active pillars on the substrate comprises:
    sequentially forming a second dielectric layer and a first mask layer that are stacked on the substrate;
    removing part of the first mask layer and part of the second dielectric layer, to form multiple second grooves arranged at intervals, wherein one of the second grooves exposes a top surface of one bit line structure; and
    forming the initial active pillar in each second groove, the initial active pillar comprising a channel region as well as a source and a drain, the source and the drain being provided on two ends of the channel region respectively.

2. The method of manufacturing a semiconductor structure according to claim 1, wherein the isolation trench comprises at least one first segment, at least one second segment, and at least one third segment;
    along the arrangement direction of the active pillars in the same row, the first segment and the second segment are sequentially arranged in a staggered manner, and the third segment is used for connecting the first segment and the second segment that are adjacent to each other; and
    in two adjacent active pillars in the same row, one active pillar is located on one side of the first segment and the other active pillar is located on the other side of the second segment respectively.

3. The method of manufacturing a semiconductor structure according to claim 1, wherein, with a plane parallel to the substrate as a cross section, a cross-sectional shape of the active pillar comprises an arc segment and a straight-line segment, the straight-line segment is connected to an end portion of the arc segment, an arc opening of the arc segment faces toward the isolation trench, and the straight-line segment is adjacent to a boundary of the isolation trench.

4. The method of manufacturing a semiconductor structure according to claim 1, wherein the step of forming multiple bit line structures in the substrate comprises:
    forming multiple first grooves that are arranged at intervals in the substrate along the row direction of the active pillars;
    forming a first barrier layer on an inner wall of each first groove, wherein a top surface of the first barrier layer is lower than the top surface of the substrate;
    filling each first groove with a first conductive layer, wherein a top surface of the first conductive layer is flush with the top surface of the first barrier layer; and
    forming a polysilicon layer on the first conductive layer, wherein a top surface of the polysilicon layer is flush with the top surface of the substrate.

5. The method of manufacturing a semiconductor structure according to claim 4, wherein after the step of forming a polysilicon layer on the first conductive layer, the method of manufacturing a semiconductor structure further comprises:
    doping the polysilicon layer with ions by ion injection.

6. The method of manufacturing a semiconductor structure according to claim 1, wherein before the step of forming the initial active pillar in each second groove, the method of manufacturing a semiconductor structure further comprises:
    forming a first oxide layer on sidewalls of each second groove, wherein a top surface of the first oxide layer is flush with a top surface of a retained first mask layer; and
    removing the first oxide layer at a bottom of the second groove and exposing the bit line structure.

7. The method of manufacturing a semiconductor structure according to claim 1, wherein the step of forming the initial active pillar in each second groove, the initial active pillar comprising a channel region as well as a source and a drain, the source and the drain being provided on two ends of the channel region respectively comprises:
    forming a silicon pillar in each second groove, wherein dopant ions in the polysilicon layer diffuse towards the silicon pillar, such that an end of the silicon pillar which faces toward the bit line contact portion forms the drain; and doping an end of the silicon pillar which is away from the bit line contact portion with ions, to form the source;

wherein a region, which is located between the source and the drain, of the silicon pillar forms the channel region of the initial active pillar.

8. The method of manufacturing a semiconductor structure according to claim 7, wherein after the step of forming a first dielectric layer covering the gate layer and covering the initial active pillars, the method of manufacturing a semiconductor structure further comprises:

forming a second mask layer on the first dielectric layer; and patterning the second mask layer, to form multiple opening regions in the second mask layer;

wherein the step of forming, in the first dielectric layer, openings extending along a row arrangement direction of the initial active pillars comprises:

removing the first dielectric layer exposed in the opening regions, to form the multiple openings in the first dielectric layer.

9. The method of manufacturing a semiconductor structure according to claim 1, wherein after the step of forming the initial active pillar in each second groove, and before the step of forming a gate layer between the active pillars, the method of manufacturing a semiconductor structure further comprises:

removing the first mask layer and the first oxide layer, to form a filling region, wherein the filling region exposes a peripheral surface of the initial active pillar; and forming a second oxide layer in the filling region, wherein the second oxide layer wraps around an outer surface of the initial active pillar and is connected to a retained second dielectric layer, and the second oxide layer and the retained second dielectric layer define a third groove.

10. The method of manufacturing a semiconductor structure according to claim 9, wherein the step of forming a gate layer between the active pillars comprises:

forming a second barrier layer on an inner wall of the third groove; and forming a second conductive layer in a region enclosed by the second barrier layer, wherein a top surface of the second conductive layer is flush with a top surface of the second barrier layer.

* * * * *